(12) United States Patent
Stoner

(10) Patent No.: US 11,307,547 B2
(45) Date of Patent: Apr. 19, 2022

(54) ANTI-THEFT POWER DISTRIBUTION SYSTEMS AND METHODS

(71) Applicant: Selene Photonics, Inc., San Leandro, CA (US)

(72) Inventor: Collin Stoner, San Leandro, CA (US)

(73) Assignee: Selene Photonics, Inc., San Leandro, CA (US)

( * ) Notice: Subject to any disclaimer, the term of this patent is extended or adjusted under 35 U.S.C. 154(b) by 305 days.

(21) Appl. No.: 16/734,812

(22) Filed: Jan. 6, 2020

(65) Prior Publication Data

US 2020/0142373 A1 May 7, 2020

Related U.S. Application Data

(63) Continuation of application No. PCT/US2018/041159, filed on Jul. 7, 2018.

(60) Provisional application No. 62/530,256, filed on Jul. 9, 2017, provisional application No. 62/530,257, filed on Jul. 9, 2017, provisional application No. 62/530,260, filed on Jul. 9, 2017.

(51) Int. Cl.
*G05B 19/042* (2006.01)
*H02J 3/00* (2006.01)
*G01R 21/00* (2006.01)

(52) U.S. Cl.
CPC .............. *G05B 19/042* (2013.01); *H02J 3/00* (2013.01); *G01R 21/00* (2013.01); *G05B 2219/2639* (2013.01)

(58) Field of Classification Search
None
See application file for complete search history.

(56) References Cited

U.S. PATENT DOCUMENTS

| 5,530,431 | A  | * | 6/1996  | Wingard ............ G08B 13/1418 |
|           |    |   |         |                         340/12.32 |
| 8,947,194 | B2 | * | 2/2015  | Sella ................... G08B 13/1409 |
|           |    |   |         |                           340/3.1 |
| 11,186,192| B1 | * | 11/2021 | Failing ..................... H02J 50/70 |
| 2002/0041250 | A1 |   | 4/2002  | Esposito |
| 2004/0082203 | A1 |   | 4/2004  | Logvinov |
| 2005/0073196 | A1 | * | 4/2005  | Kamiya ................ B60R 25/252 |
|              |    |   |         |                          307/10.3 |

(Continued)

FOREIGN PATENT DOCUMENTS

WO    WO 2019/014074    1/2019

*Primary Examiner* — Jason Lin
(74) *Attorney, Agent, or Firm* — Phillips Winchester; Justin K. Flanagan

(57) ABSTRACT

An anti-theft system and method for encoding power for distribution to a load (e.g., a house) and a decoding of the encoded power at the load for consumption. A meter with an integrated decoder may be installed proximate a house (or another load). In some embodiments, the combination meter/decoder system may be configured to replace a traditional meter on a standard service panel, to minimize any impact or changes to the home or other building. In other embodiments, an add-on decoder system may be configured for installation between a standard meter and a service panel (optionally, plug and play). Alternatively, an add-on decoder system may be installed with the meter positioned (electrically) between the add-on decoder system and the service panel of the house (or other type of load or consumer).

20 Claims, 46 Drawing Sheets

(56) References Cited

U.S. PATENT DOCUMENTS

| | | |
|---|---|---|
| 2008/0077336 A1 | 3/2008 | Fernandes |
| 2008/0109387 A1 | 5/2008 | Deaver |
| 2008/0282817 A1* | 11/2008 | Breed .................... G06F 3/0238 73/865.9 |
| 2009/0295551 A1* | 12/2009 | Dickey ..................... H02J 3/00 340/568.2 |
| 2009/0315535 A1 | 12/2009 | Lee, Jr. |
| 2011/0202308 A1* | 8/2011 | Kishida ................ G01D 5/2449 702/151 |
| 2011/0302078 A1* | 12/2011 | Failing .................... B60L 53/67 705/39 |
| 2013/0026988 A1* | 1/2013 | Igata ........................ B60L 53/20 320/109 |
| 2017/0110134 A1* | 4/2017 | Disch .................... G10L 19/025 |
| 2019/0123580 A1* | 4/2019 | Bindea ................ G05B 13/026 |

* cited by examiner

US 11,307,547 B2

ANTI-THEFT POWER DISTRIBUTION SYSTEMS AND METHODS

RELATED APPLICATIONS

This application is a continuation of and claims priority to PCT Patent Application No. PCT/US2018/041159 filed Jul. 7, 2018 titled "Anti-Theft Power Distribution Systems and Methods" which claims priority to each of: U.S. Provisional Patent Application No. 62/530,256 filed Jul. 9, 2017 titled "Anti-Theft Power Distribution Systems and Methods;" U.S. Provisional Patent Application No. 62/530,257 filed Jul. 9, 2017 titled "Meter-Integrated Anti-Theft Power Distribution Systems and Methods;" and U.S. Provisional Patent Application No. 62/530,260 filed Jul. 9, 2017 titled "Add-On Anti-Theft Systems and Methods." each of which is hereby incorporated by reference in its entirety.

TECHNICAL FIELD

This disclosure relates to secure power transmission and distribution using encoders and decoders. Specifically, anti-theft systems and methods include encoding split-phase or multi-phase power for distribution and decoding the same for consumption by a load.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1A:
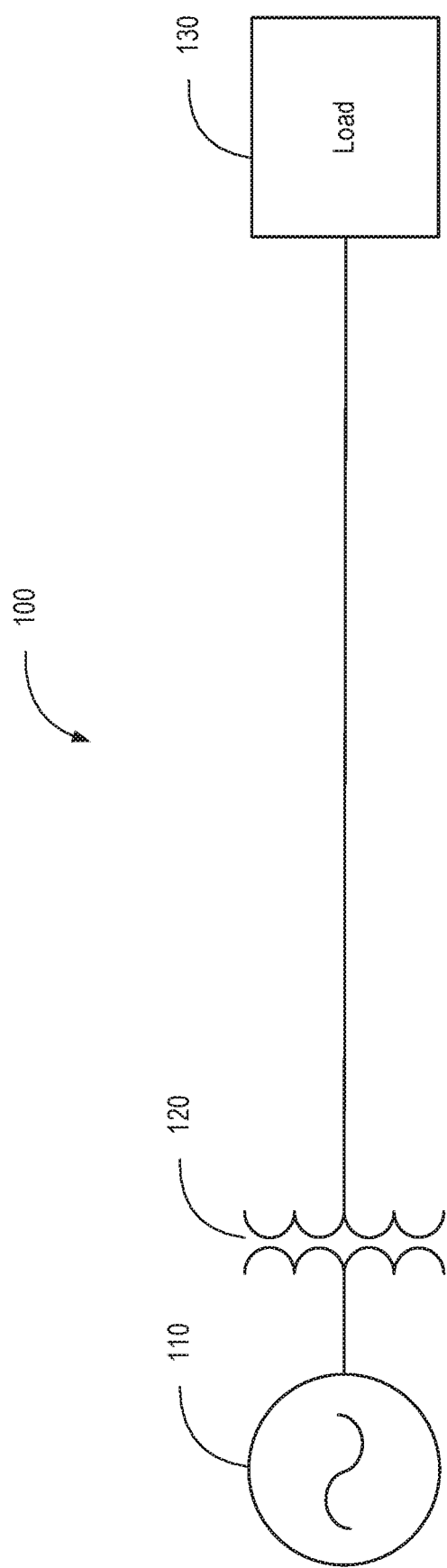
FIG. 1A illustrates a simplified one-line diagram of a power source providing power via a transformer to a load via a transmission line, according to one embodiment.

Electric power may be generated or produced using a wide variety of techniques, systems, and methods. For example, electric power may be generated via turbines rotated within fossil fuel combustion power plants, hydroelectric dams, and/or nuclear reactors. Similarly, electric power may be generated using wind turbines or various renewable resources such as photovoltaic (PV) cells or other solar-generated power. Regardless of the source, the initial generation of power may be at voltages too low for suitable transmission over long distances. For example, a diesel generator may produce electric power at 12.6 KV. The power may be stepped-up via a transformer to a higher voltage (e.g., 69 KV, 115 KV, 500 KV, etc.) for transmission over long distances at (relatively) lower currents on transmission lines.

High voltage transmission lines may be stepped down for industrial and residential distribution to various loads. Electrical power can be characterized by three principal properties: configuration, voltage, and frequency. For example, industrial installations may utilize 480 Volt (480 V) three-phase power while residential homes may utilize split-phase 240 V power. The voltage and frequency of electrical power varies by region and country. For example, a nominal residential voltage of 230 V at a frequency of 50 Hz is used in Europe, most of Africa, most of Asia and much of South America and Australia. The most common combination in North America is 120 V and 60 Hz. Other voltages and frequencies exist in other regions and countries. However, residential voltages are generally in the range of 100 V to 240 V expressed as root-mean-square (RMS) values. The most common frequencies are 50 Hz and 60 Hz. The systems and methods described herein can be adapted for use at any of a wide range of voltages, frequencies, and phase configurations, including configurations with and without a dedicated neutral wire.

A distribution transformer proximate a load may be used to step-down the voltage from high-voltage transmission levels to industrial or residential distribution levels. A distribution line may then convey the electric power from the distribution transformer to the load.

It is possible for individuals to intercept (e.g., steal) the electric power on the distribution line by conductively or even inductively coupling conductors between the distribution line and another load. The intended power recipient may not notice any change in power delivery and the producer of power may only see the extra consumption and assume the intended power recipient has simply increased power consumption. In situations in which the consumption of power is metered, the intercepting entity may be able to steal electric power by "tapping" into the distribution line before the meter. Detection of the theft, and even prevention of the theft, may be very difficult if not impossible using standard equipment and metering techniques.

The presently described systems and methods provide a way to encode electric power on a transmitting end (e.g., at a distribution transformer) and decode the electric power at a receiving end (e.g., at a house or building, optionally at a metered location on a house or building). The described systems and methods provide encoding and decoding of electrical power for the various configurations, voltages, and frequencies used in various regions and countries of the world.

For example, the encoder, according to any of the embodiments described herein, may be attached to a transformer, integrated within a transformer system, and/or otherwise associated and positioned proximate a transmitting end of a power distribution system. The decoder, according to any of the embodiments described herein may be integrated within a meter/decoder combination system. Thus, rather than installing a traditional meter on a house or building, a power distribution entity or an agent thereof may install a specialized meter with an integrated decoder (which could instead be called a decoder with an integrated meter).

According to any of the embodiments described herein, the encoder may place electrical power on one or more of many conductors connected to both the encoder and decoder in a time varying pattern known only to the encoder, decoder, and/or their controllers. Those attempting to "tap" into the power lines are unaware of the pattern and therefore are unable to "steal" power. In addition to the pattern being time varying, the frequency at which the patterns change may also vary with time. An arbitrarily complex mechanism may be employed as long as both encoder and decoder are aware of the pattern. In other embodiments, the decoder may detect the code (e.g., via an analog or digital signal and/or via one or more sensors) and adapt accordingly. In such embodiments, the decoder may not necessarily be preprogrammed with information for decoding.

The phrases "connected to" and "in communication with" refer to any form of interaction between two or more components, including mechanical, electrical, magnetic, and electromagnetic interaction and thus may include both conductive connections and inductive connections. Two components may be connected to each other, even though they are not in direct contact with each other, and even though there may be intermediary devices, conductors, switches, etc. between the two components.

The systems and methods described herein may be combined with, integrated within, and/or used in conjunction with remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. In some embodiments, encoders and/or decoders may be connected to a wired or wireless network, and communication on the network may be facilitated by networking devices including, but not limited to, multiplexers, access points, routers, hubs, gateways, firewalls, and switches. Furthermore, networking and communication devices may be incorporated in an encoder and/or decoder or be in communication with an encoder and/or decoder. The terms "encoder" and "decoder" may be used interchangeably to describe an individual encoder or decoder, respectively, or a system comprising multiple encoders and decoders, respectively.

In some embodiments, encoders and/or decoders may be preprogrammed to specific encoder/decoder patterns and/or processes. These programmed patterns and/or processes may be mutable via common input from systems outside of the encoder/decoder system. For example, the encoder/decoder pair may expect the power to be switched from conductor to conductor at some rate that is dependent on the time of day received from some outside service. There are many possible outside signal sources that could be used to modify the encoding/decoding pattern.

In some embodiments, encoders and decoders may be implemented to modify their encoding/decoding scheme based on a consumer-derived password, biometric, and/or other personal identifier. This enables the pattern to be essentially unknown to both provider and consumer, but tractable by the encoder/decoder pair.

In some embodiments, encoders and decoders may be implemented to modify their encoding/decoding scheme based on a key sent to the encoders/decoders from the power provider. The power provider may determine why, how, and/or when to change keys based on factors such as evidence of theft, data indicating strange behavior, and/or other factors.

In some embodiments, encoders and decoders may transmit and receive power at non-standard voltages, frequencies, and/or phases. These non-standard power characteristics are in and of themselves an encoding/decoding pattern that can reduce theft. For example, encoders can accept power with standard regional characteristics and transmit power with non-standard proprietary characteristics to the associated decoder. The decoder can then convert received power back into power with standard regional characteristics.

In some embodiments, encoders and/or decoders may encode and decode the neutral wire along with those carrying power. This approach makes it more difficult to steal power.

In some embodiments there will be one or more connections or conductors between the encoder and decoder that at any given time will not be carrying power. These lines can be used to carry neutral, ground, and/or be left unconnected. Alternatively, a standard or preset voltage can be transmitted on conductors not currently being used by the encoder/decoder system and current flow can be detected and/or measured. If current flow is detected, power is being stolen from the system at this location. This data can be logged and the line and location can be inspected.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as using microprocessors, microcontrollers, general-purpose computers, industrial-computers, FPGAs, discrete electrical components, surface mount components, or application specific integrated circuits (ASICs). Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1A illustrates a simplified one-line diagram 100 of a power source 110 providing power via a transformer 120 to a load 130 via a transmission line, according to one embodiment. The transmission line, load, generator, transformer, etc. may be configured for any of a wide variety of voltages, current values, frequencies of transmission, and phase configurations. For example, power transmission from the transformer 120 to the load 130 may be at 480 V, 60 Hz, and via a three-phase delta configuration. As another example, power transmission may be at 208 V, 50 Hz, and via a three-phase wye configuration. Any of these configurations and other configurations not explicitly listed may be combined with the systems and methods described herein.

Electrical power may be encoded at the transmitting end of power distribution and decoded at a receiving or consuming end of the power distribution for any voltages, currents, frequencies, and power configurations that include the reception of at least two "hot" conductors being distributed to the load.

The patterns used to encode and decode power on transmission lines between encoders and decoders may be based on time varying patterns or more complex algorithms. For example, the timing of pattern change may be based on some external signal available to both the encoder and decoder. The encoder and decoder may base their pattern on some consumer provided password, biometric, or other "secret." Additionally, the encoding/decoding scheme may include the use of power transmission in non-standard configurations, voltages, frequencies, and/or phases.

Figure 1B:
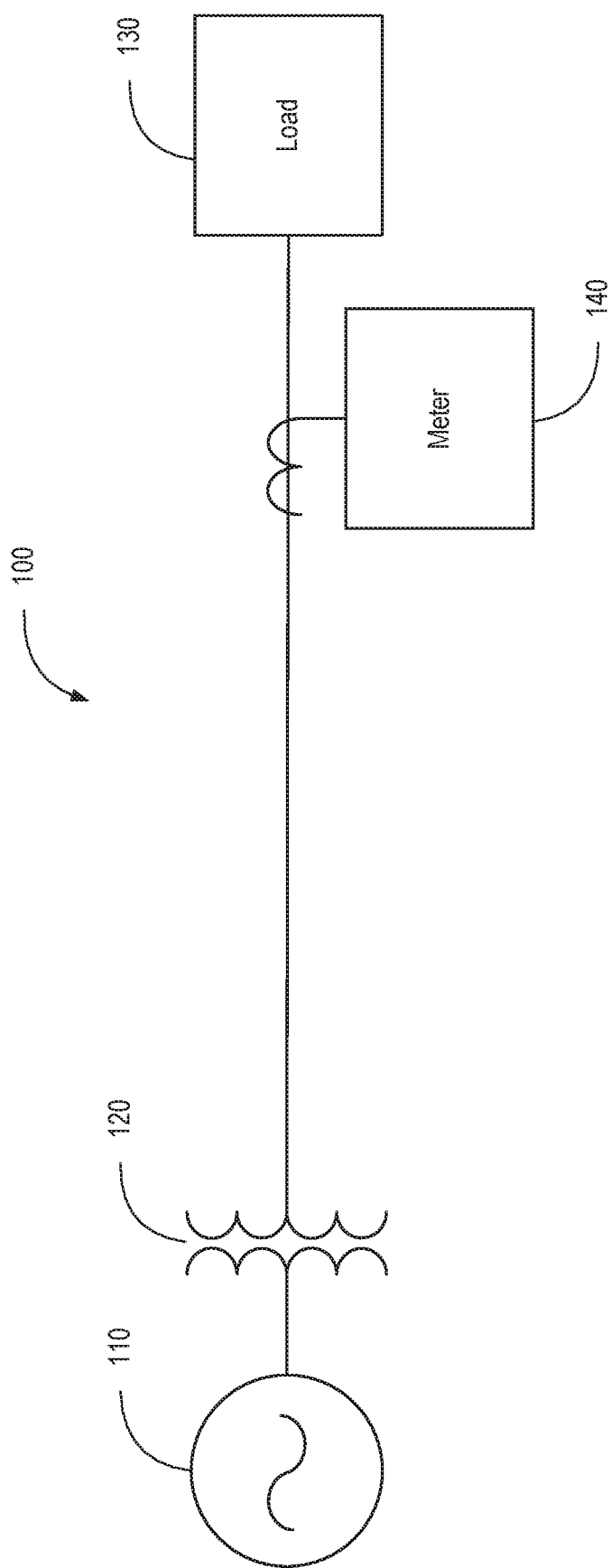
FIG. 1B illustrates a simplified one-line diagram of a power source providing power via a transformer to a metered load via a transmission line, according to one embodiment.

FIG. 1B illustrates a simplified one-line diagram 100 of the power source 110 providing power via the transformer 120 to a load 130 that is metered by a meter 140. As before, the transmission line, load, generator, transformer, etc. may be configured for any of a wide variety of voltages, current values, frequencies of transmission, and phase configurations. Any of these configurations and other configurations not explicitly listed may be combined with the systems and methods described herein.

Figure 2A:
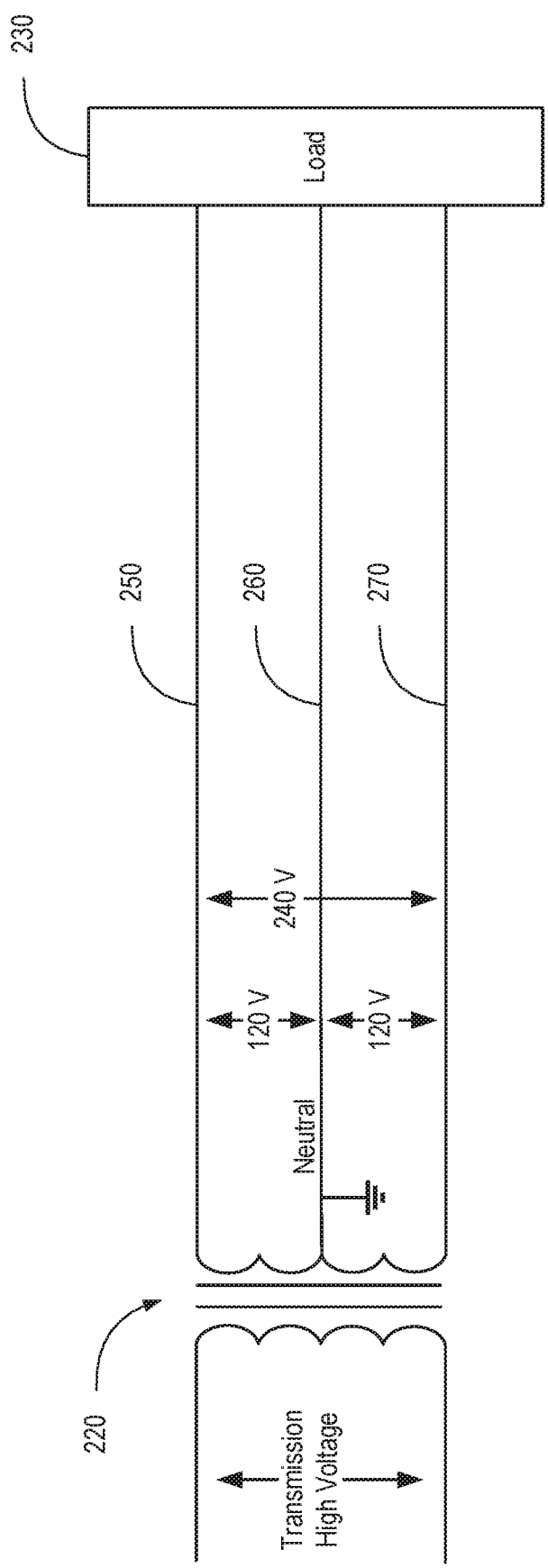
FIG. 2A illustrates an example of a high-voltage power transmission being transformed via a transformer to produce a split-phase 240 Volt (240 V) distribution provided to a load, according to one embodiment.

FIG. 2A illustrates an example of split-phase 240 V distribution from a high-voltage transmission line to a load 230, according to one embodiment. As illustrated, a transformer 220 may step-down the transmission high voltage to a split-phase 240 V distribution scheme. The split-phase 240 V system may operate at, for example, 50 Hz or 60 Hz. As illustrated, the A-phase 250 may have a voltage magnitude of 120 V, a neutral wire 260 ideally carries 0 V, and a B-phase 270 may have a voltage magnitude of 120 V that is 180° out of phase with respect to the A-phase 250.

The anti-theft system of encoding electrical power for distribution and decoding electrical power for consumption at the load 230 can be used with the split-phase 240 V distribution scheme illustrated in FIG. 2A.

Figure 2B:
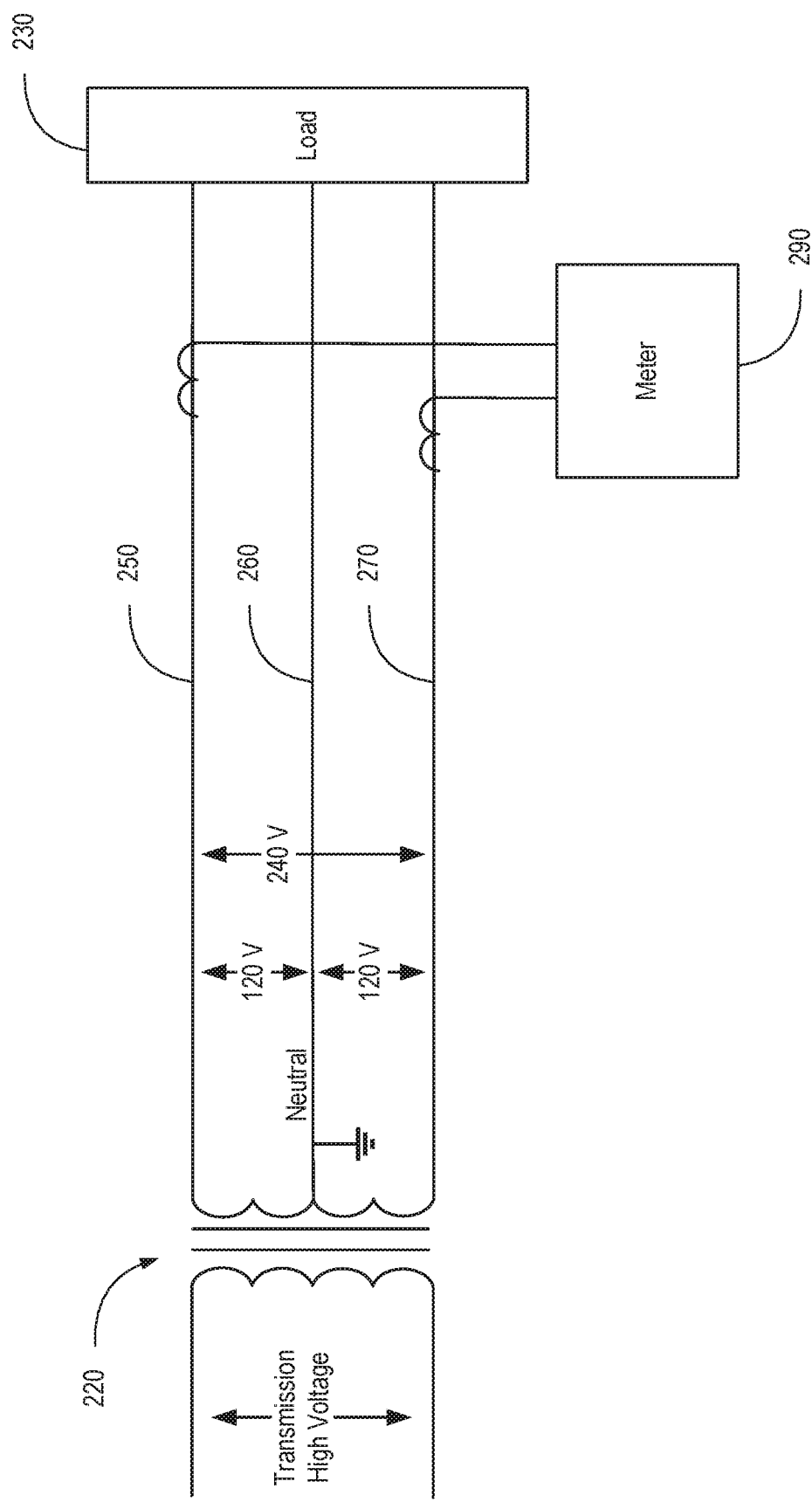
FIG. 2B illustrates an example of a high-voltage power transmission being transformed via a transformer to produce a split-phase 240 V distribution provided to a metered load, according to one embodiment.

FIG. 2B illustrates an example of split-phase 240 V distribution from a high-voltage transmission line similar to that described in conjunction with FIG. 2A, but with the addition of a meter 290 to meter the power consumed by the load 230, according to one embodiment.

Figure 3A:
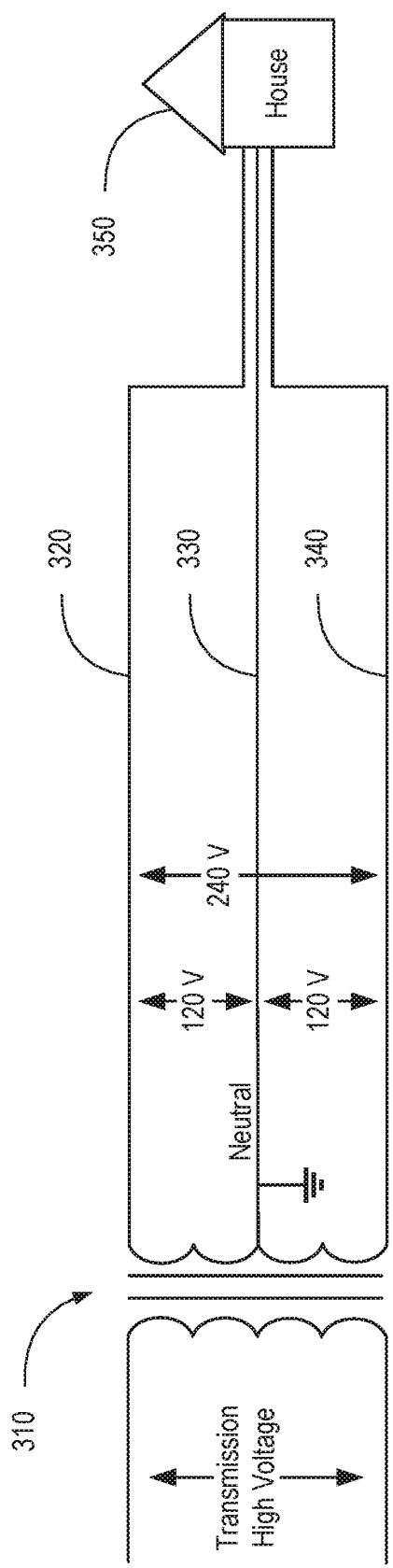
FIG. 3A illustrates a specific example of a high-voltage power transmission being transformed via a transformer to produce a split-phase 240/120 V distribution to a house, according to one embodiment.

FIG. 3A illustrates a specific example of split-phase 240/120 V distribution to a house 350, according to one embodiment. Again, a transformer 310 may step-down the voltage to 120 V on the A-phase 320 and 120 V 180° out of phase on the B-phase 340. A center tap neutral wire 330 may provide a 0 reference. The anti-theft system of encoding electrical power for distribution and decoding electrical power for consumption at the house 350 can be used with the split-phase 240 V distribution scheme illustrated in FIG. 3A.

Figure 3B:
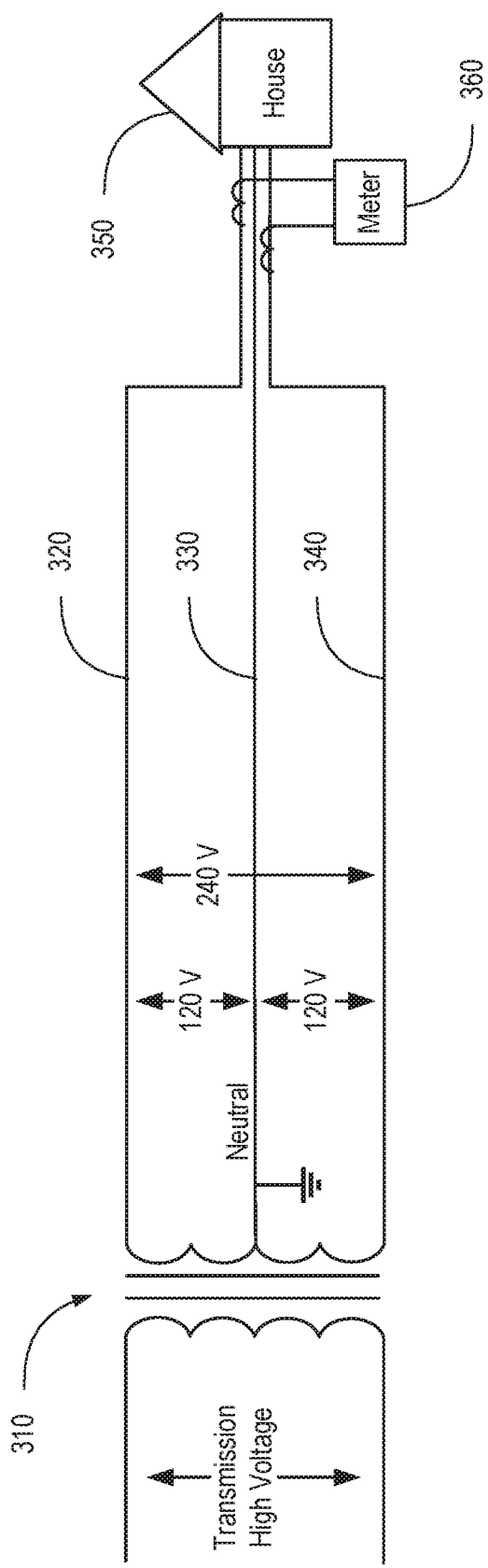
FIG. 3B illustrates a specific example of a high-voltage power transmission being transformed via a transformer to produce a split-phase 240/120 V distribution to a metered house, according to one embodiment.

FIG. 3B is similar to the example described in conjunction with FIG. 3A, but with the addition of a meter 360 to meter the power consumed by the house 350, according to one embodiment.

Figure 4A:
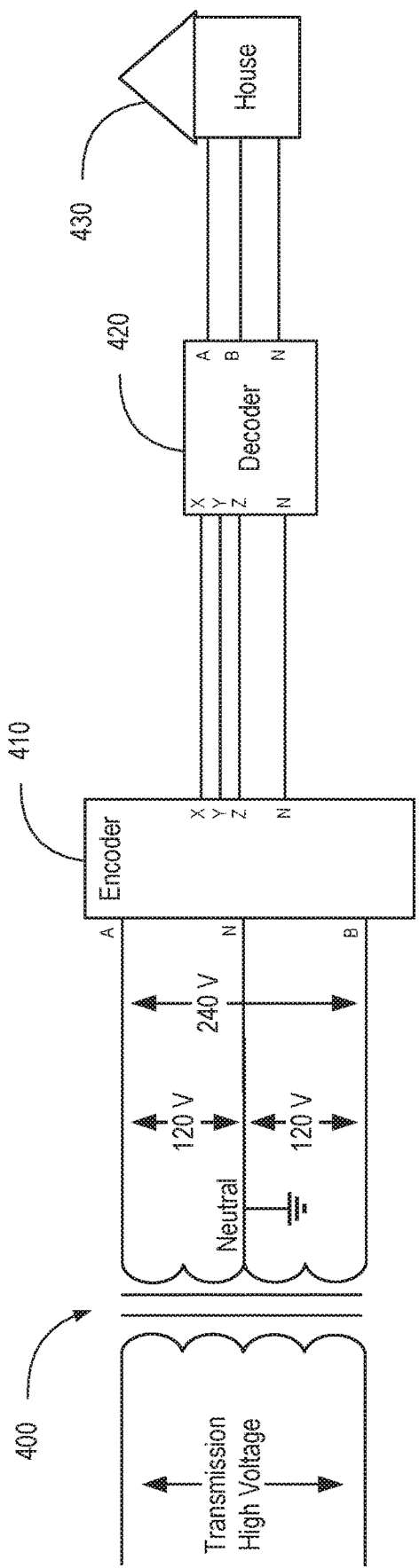
FIG. 4A illustrates a block diagram of an encoder for encoding an A-phase and a B-phase onto three wires for subsequent decoding via a decoder proximate the house, according to one embodiment.

FIG. 4A illustrates a block diagram of an encoder 410 for encoding an A-phase and a B-phase onto three wires for subsequent decoding via a decoder 420 proximate the house 430, according to one embodiment. As illustrated, a transformer 400 steps-down a high voltage transmission line to a split-phase 240 V distribution scheme. Typically, the A-phase, B-phase, and the neutral wire would be carried from the transformer 400 to the house 430. However, it is possible that an individual desiring to steal the power could simply connect wires to one or both the A-phase and the B-phase. Optionally, the individual could connect to the neutral wire as well or simply establish their own ground reference at their residence to accomplish the theft.

The encoder 410 is configured to receive the neutral wire and pass it straight through to the decoder 420 and then on to the house 430. However, the encoder 410 receives the A-phase and the B-phase and sends them onto distribution wires X, Y, and Z on a time varying basis. For example, during a first time period, the A-phase may be carried on the X-wire and the B-phase may be carried on the Y-wire. During this first time period, the Z-wire may be unused, carry a nominal voltage, or be set to 0 V. In some embodiments, the unused wire (e.g., the Z-wire during the first time period) may be physically grounded, connected to the neutral wire, or carry test power with current metering to detect unauthorized use.

During a second time period, the A-phase may be carried on the Y-Wire and the B-phase may be carried on the Z-wire. During the second time period, the X-wire may be unused or used for theft detection. During a third time period, the Z-wire may carry the A-phase and the X-wire may carry the B-phase, while the Y-wire is unused or being used for theft detection.

The above example describes one possible embodiment of a time-varying rotational encoding of two phases of power onto three distribution wires. The rotational encoding of two phases of power need not be sequentially ordered, nor need they be continuous, nor even occur at the same time. For example, in some embodiments, the B-phase may be switched to a different wire only half as often as the A-phase. Moreover, the time periods at which each phase is encoded or switched to a new distribution wire may or may not be associated with the transmission frequency of the power.

For example, in one embodiment, the split-phase 240 V power system may carry power at 60 Hz. Another embodiment may include split-phase 240 V power at 50 Hz. The encoder 410 may rotationally encode the A-phase and the B-phase once every cycle, once every ten cycles or once every hundred cycles. Alternatively, the encoder 410 may be configured to rotationally encode the A-phase every 1 second, every 200 milliseconds, or every 10 seconds. In yet another embodiment, each time period may not be the same duration. For example, the first time period may be shorter than the second time period and the third time period may be much longer. In addition, the time periods may be dependent on some external signal.

In still further embodiments, the duration of each time period may be random. The rotation of whether the A-phase is rotated, the B-phase is rotated, or both phases are rotated may be predefined or random. Moreover, the distribution wire to which each phase is rotated for any given time period may be predefined, follow a pattern, or be randomized.

The decoder 420 receives the time-varying encoding of the two phases on the three wires and decodes the distributed power back into an A-phase and a B-phase for consumption by the load (e.g., house 430). In embodiments in which the time-varying rotational encoding is predefined or follows a set pattern, the decoder 420 may simply reverse the predefined scheme or pattern to decode the power. In embodiments in which the rotational encoding is random or does not follow a predefined pattern, the decoder 420 may include detection circuits to detect which of wires X, Y, and Z are powered and correctly route the power to the output A-phase and output B-phase.

In another embodiment, the encoder 410 may communicate wirelessly, via a separate wired communication channel, or via wires X, Y, and Z with the decoder 420. For example, in some embodiments, encoder 410 may use the X-wire and the Z-wire to distribute the A-phase and the B-phase during a first time period. The encoder 410 may use the Y-wire to transmit a message (e.g., serially) to the decoder 420 informing it when it will rotate the phase transmission and/or to which wire each phase will be rotated.

Figure 4B:
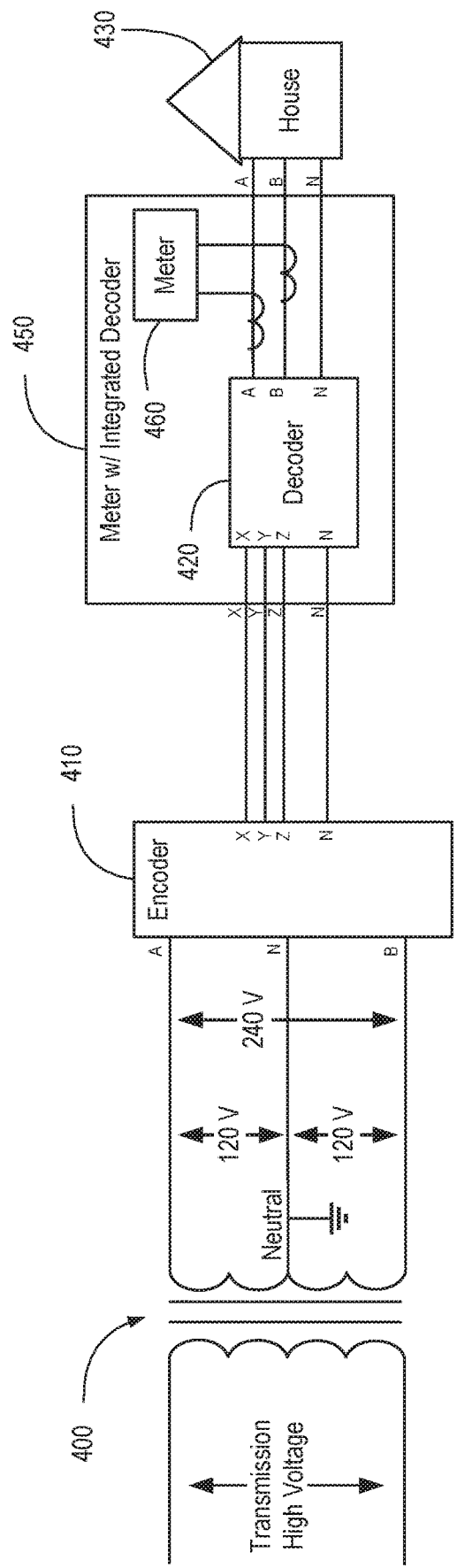
FIG. 4B illustrates a block diagram of an encoder for encoding an A-phase and a B-phase onto three wires for subsequent decoding via a meter with an integrated decoder proximate the house, according to one embodiment.

FIG. 4B illustrates the decoder 420 integrated within a metering system 450 that includes both the decoder 420 and a meter 460. In various embodiments, an outside service panel of the house 430 (or other building) may include a mounting location for a meter, such as meter 460. Instead of installing a traditional meter, a meter with an integrated decoder may be installed in its place to decode the encoded power via decoder 420 and perform the metering function via integrated meter 460.

Figure 4C:
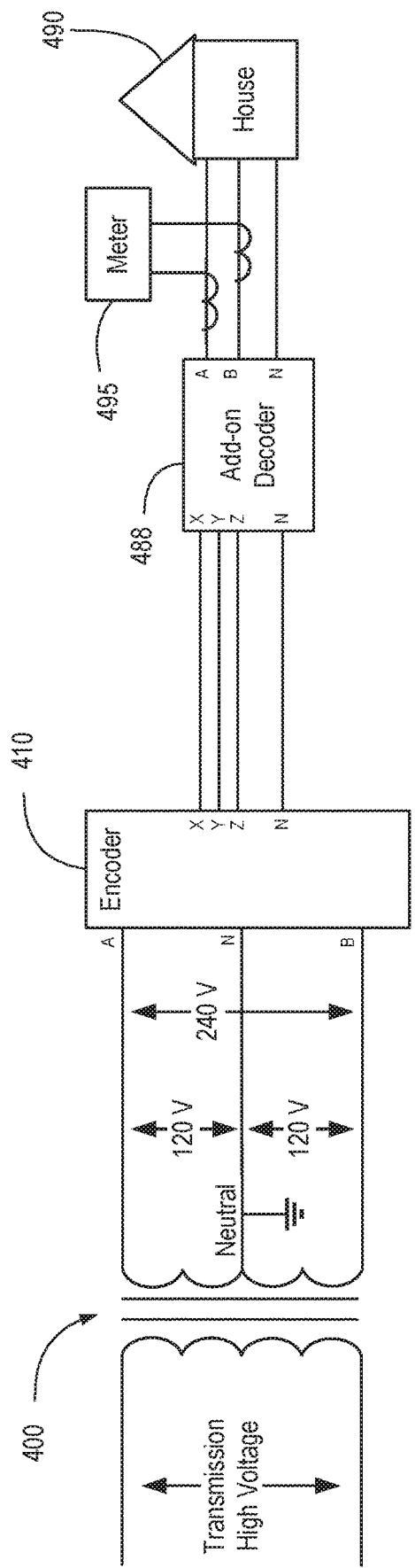
FIG. 4C illustrates a block diagram of an encoder for encoding an A-phase and a B-phase onto three wires for subsequent decoding via an add-on decoder positioned before a meter proximate the house, according to one embodiment.

FIG. 4C illustrates a block diagram of an encoder 410 for encoding an A-phase and a B-phase onto three wires for subsequent decoding via an add-on decoder 488 positioned before a meter 495 proximate the house 490, according to one embodiment. In the illustrated embodiment, the meter 495 may be a conventional meter (potentially an existing meter) and the add-on decoder 488 is added to the system in conjunction with the encoder 410 for secure (theft-resistant) power distribution between the distribution transformer 400 and the house 490.

Figure 4D:
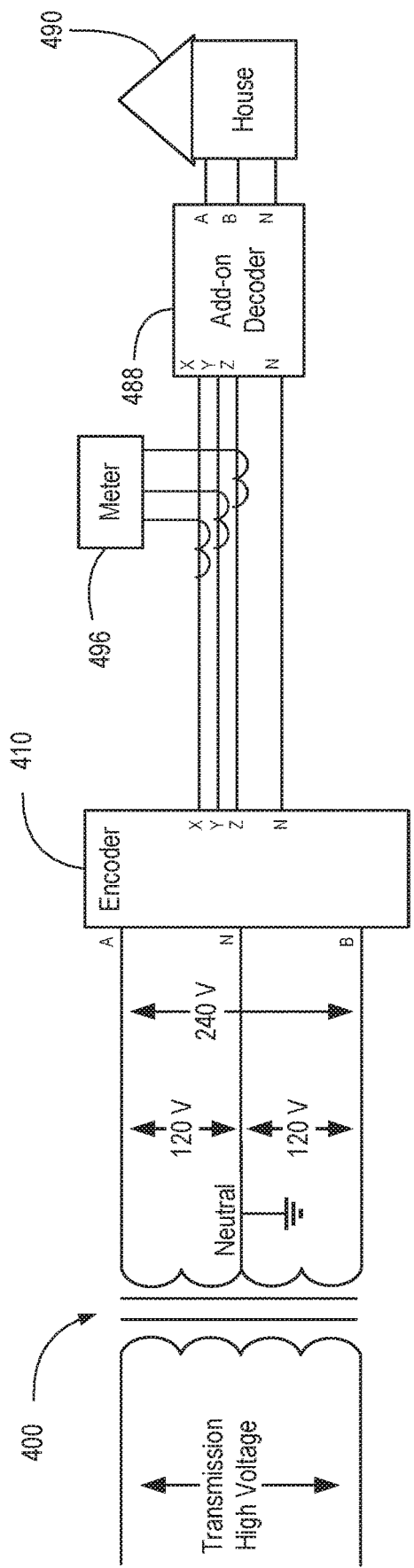
FIG. 4D illustrates another embodiment of an encoder and decoder system with an add-on decoder positioned between a meter and a house, according to one embodiment.

FIG. 4D illustrates a block diagram of an encoder 410 for encoding an A-phase and a B-phase onto three wires for subsequent decoding via an add-on decoder 488 positioned between a meter 496 and the house 490, according to one embodiment. In the illustrated embodiment, the meter 496 may be a conventional meter that has the ability to meter three phase lines, only two of which will be active at the same time for power flow. Again, the add-on decoder 488 is added to the system in conjunction with the encoder 410 for secure (theft-resistant) power distribution between the distribution transformer 400 and the house 490.

Figure 4E:
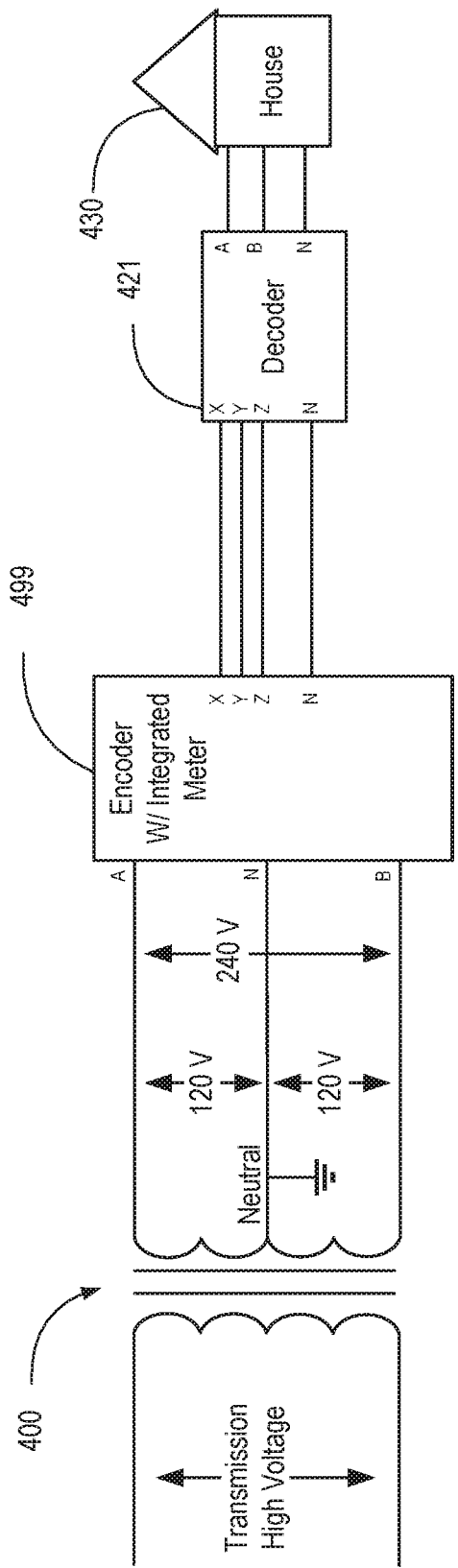
FIG. 4E illustrates another embodiment of an encoder with an integrated metering system in which a decoder replaces the meter of a house, according to one embodiment.

FIG. 4E illustrates a block diagram of an encoder 499 with an integrated meter for encoding an A-phase and a B-phase onto three wires for subsequent decoding via a decoder 421 proximate the house 490, according to one embodiment. In various embodiments, the decoder 421 may replace an existing meter in a plug-and-play fashion. For example, the existing service panel of a house may have a connection point for a traditional meter. The decoder 421 may plug directly into the location originally meant for the traditional meter. Some rewiring of the internal components of the service panel may be required in some instances, depending on whether the service panel is meant for the meter to be installed in parallel with service to the house or in series.

In still other embodiments, a service panel on a house may include an existing meter and a service breaker (e.g., 200 amp breaker). The decoder may be installed in place of the service breaker and/or in conjunction with the service breaker. For example, the decoder may be directly connected to the bus bars of the service panel. In some instances, the existing meter may be left in place for metering (potentially with some internal rewiring of the service panel, and in other instances the meter may be removed as unnecessary if metering is performed in conjunction with the encoder (e.g., as illustrated in FIG. 4E)).

In various embodiments, the service panel of the house may have its existing meter removed and/or may keep its existing meter in place (in addition to the meter 496 of FIG. 4D). In other embodiments, a decoder may be added to a house in place of or in addition to an existing meter. For instance, a traditional meter of a house may be removed and discarded. In its place a decoder may be installed. With reference to FIG. 4D, a meter may be electrically installed (a) within the house 490, (b) between the decoder 488 and a service panel in the house 490, (c) electrically in front of the decoder 488 as illustrated in FIG. 4D, (d) right after the encoder 410 remote from the house 490, (e) electrically in front of the encoder 410 but after the transformer 400, and/or (f) even on the high voltage side of the transformer 400. The meter may be adapted as needed, depending on the location of the installed meter.

Figure 5A:
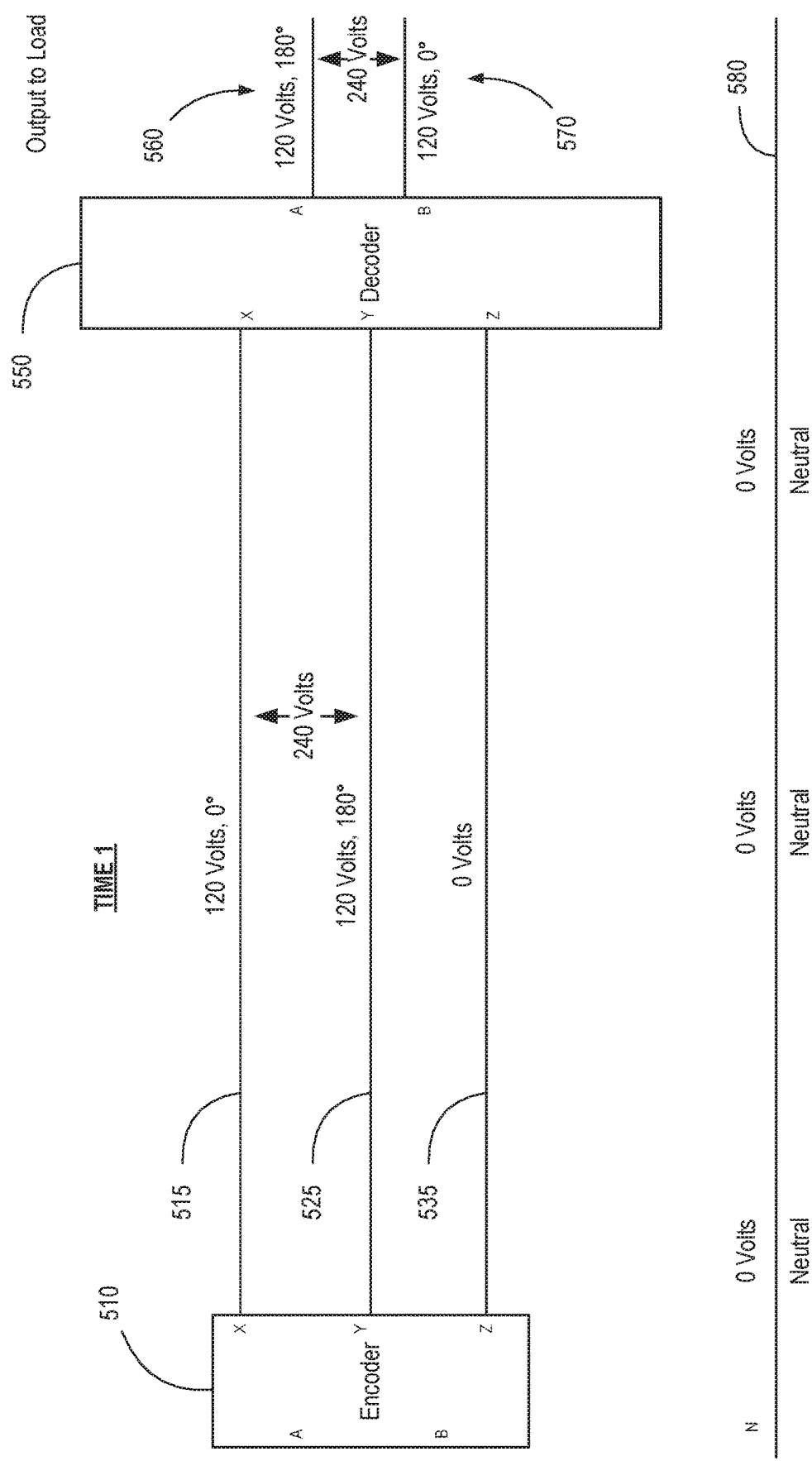
FIG. 5A illustrates the three wires with encoded power in a first encoding rotation at a first time, according to one embodiment.

FIG. 5A illustrates the three wires with encoded power in a first encoding rotation at a first time, according to one embodiment. As illustrated, encoder 510 receives an A-phase and a B-phase. At Time 1, the X-wire 515 carries 120 V and the Y-wire 525 carries 120 V, but at 180° out of phase such that the instantaneous voltage difference between the X-wire 515 and the Y-wire 525 is 240 V. The Z-wire 535 may be unused, grounded, connected to the neutral wire, used for communication, used to detect unauthorized or unexpected use, etc. The decoder 550 decodes the X, Y, and Z-wires to correctly route them to the output A-phase and B-phase 560 and 570 to distribute split-phase 240 V power to a load using the carried-through neutral wire 580 to provide 120 V power to the load.

Figure 5B:
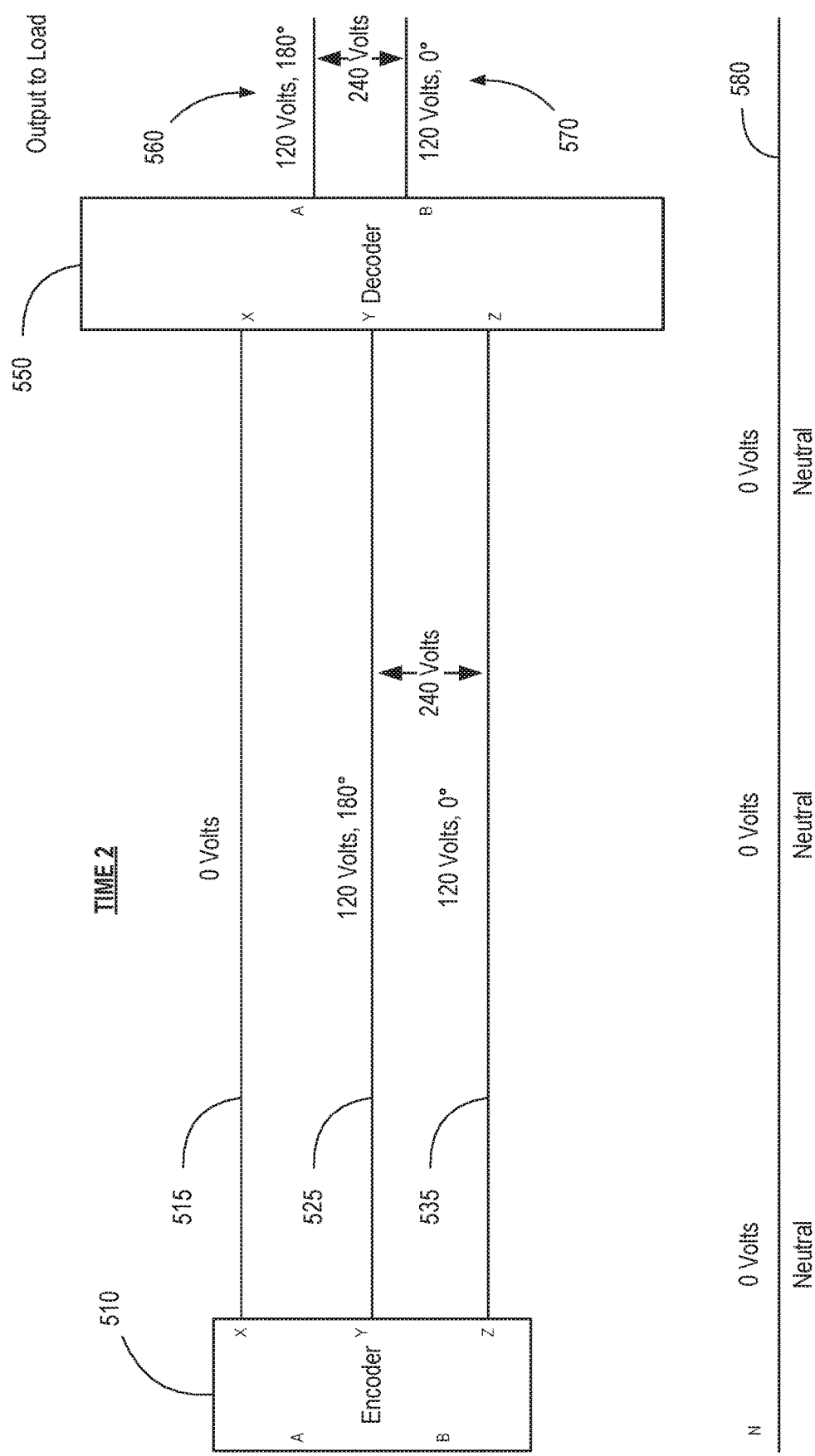
FIG. 5B illustrates the three wires with encoded power in a second encoding rotation at a second time, according to one embodiment.

FIG. 5B illustrates the three wires with encoded power in a second encoding rotation at a second time, during which the Z-wire 535 is used instead of the X-wire 515, according to one embodiment. The X-wire 515 may be used to carry ground, neutral, used for communication, and/or to detect inappropriate use.

Figure 5C:
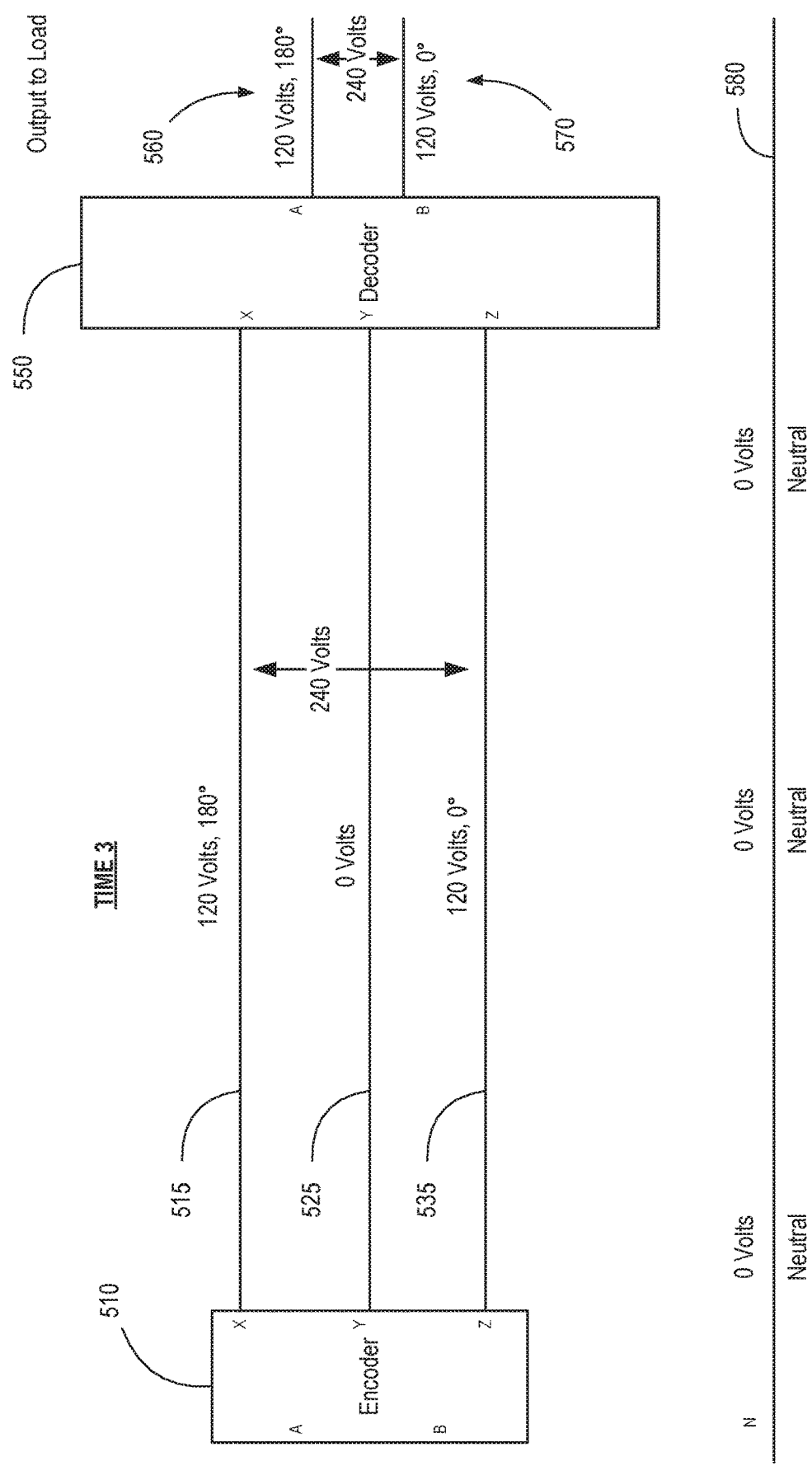
FIG. 5C illustrates the three wires with encoded power in a third encoding rotation at a third time, according to one embodiment.

FIG. 5C illustrates the three wires with encoded power in a third encoding rotation at a third time, during which the Y-wire 525 becomes unused, according to one embodiment. In each of FIGS. 5A-5C, the decoder 550 provides consistent and uninterrupted power to a load. However, as is readily apparent, if an individual were to try to steal power between the encoder (potentially located at the transformer) and the decoder (potentially located at the load), there would be four wires to "tap": a neutral wire 580, the X-wire 515, the Y-wire 525, and the Z-wire 535.

Attempting to use any one of the X-wire 515, the Y-wire 525, or the Z-wire 535 without the proper decoding would result in intermittent power. The tapped wire would be de-energized (or at least not conveying the desired 120 V power) during ⅓ of the time periods—which may or may not correspond to ⅓ of the time. Attempting to simply connect two of the X, Y, or Z wires together would result in a fault (potentially tripping a breaker and alerting an owner to the theft). Thus, the encoded distribution of power and subsequent decoding of power provides an anti-theft system for electrical power distribution.

In some embodiments, while one of the wires is de-energized for use by the decoder, it could be energized with test power (predefined current and/or voltage values) to identify unexpected or unauthorized use. A test voltage can be transmitted on the unused conductor and current flow measured. If current flow is detected, power is being stolen from the system at this location. This data can be logged, and the line and location can be inspected. In some embodiments, the test voltage/current available for stealing may be provided at a phase and/or frequency that makes it suboptimally useable, or even unusable, for most domestic and industrial applications. In other embodiments, the test voltage/current may be provided in such a manner as to make it indistinguishable to the end user. In such an embodiment, power theft may be detected without alerting the thief.

Figure 6:
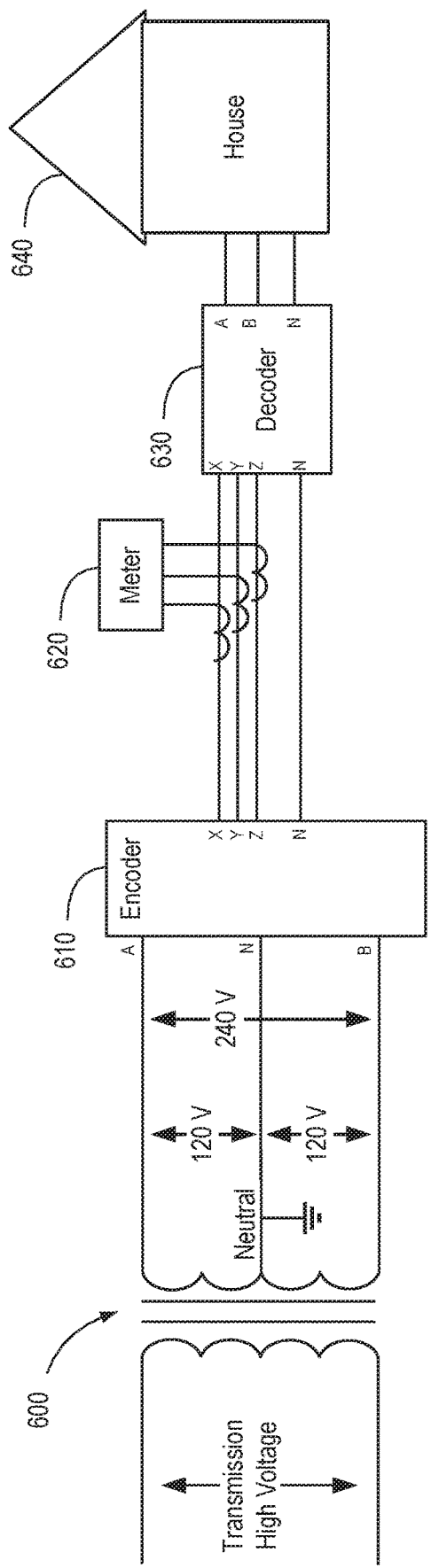
FIG. 6 Illustrates an alternative embodiment in which the A-phase and the B-phase are encoded for distribution of 240/120 V split-phase power to a house via a meter and decoder, according to one embodiment.

FIG. 6 is similar to that shown and described in conjunction with FIG. 4B, except that the meter 620 meters all three of the X-wire, Y-wire, and Z-wire before the decoding is accomplished. In some embodiments, such a configuration would allow for the integration of the meter 620 and the decoder 630 into a single unit that could be installed on the traditional service panel of a house 640 or other building. Any power consumption (including losses) by the decoder 630 would still be metered by the meter 620. In contrast, the configuration in FIG. 4B would not include the power consumed by the decoder in the metered value. In some embodiments, an integrated metering/decoding system may include meters before and after the decoder. FIG. 6 includes a transformer 600 and an encoder 610, as previously described.

Figure 7A:
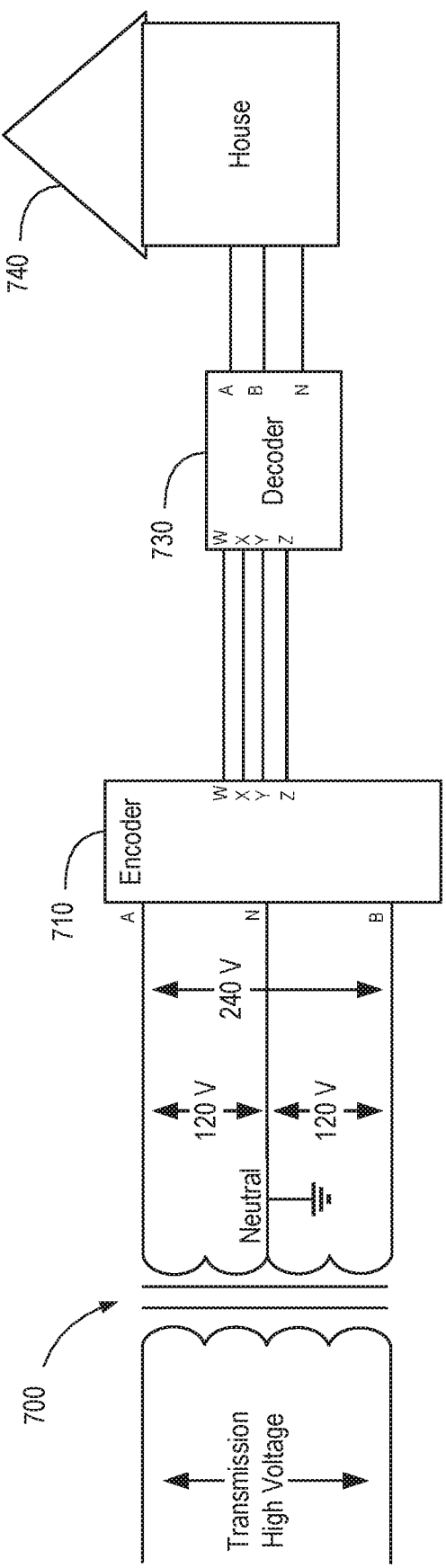
FIG. 7A illustrates four wires with encoded power and associated decoding, according to one embodiment.

FIG. 7A Illustrates an alternative embodiment in which the A-phase, the B-phase, and a neutral line from a transformer 700 are all encoded by an encoder 710 for distribution of 240/120 V split-phase power to a house 740, according to one embodiment. In the illustrated embodiment, each of the A-phase, B-phase, and the neutral are time-varyingly encoded on four distribution wires, W, X, Y, and Z. A decoder 730 decodes the distribution wires for the house 740. The encoder 710 and decoder 730 may function according to any of the various embodiments described herein, including combinations thereof.

Figure 7B:
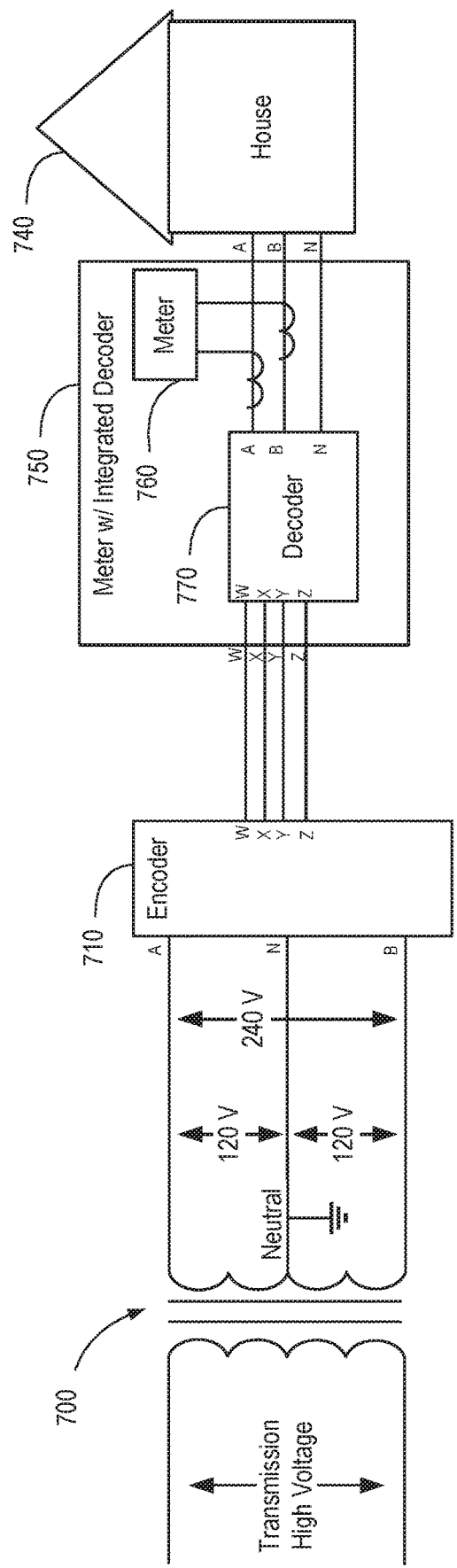
FIG. 7B illustrates four wires with encoded power and a meter with an integrated decoder, according to one embodiment.

FIG. 7B illustrates a decoder/metering system 750 that includes both the decoder 770 and a meter 760. In various embodiments, an outside service panel of the house 740 (or other building) may include a mounting location for a traditional meter. Instead of installing a traditional meter, a meter/decoding system 750 with an integrated decoder 770 may be installed in its place to decode the encoded power via decoder 770 and perform the metering function via integrated meter 760.

Figure 7C:
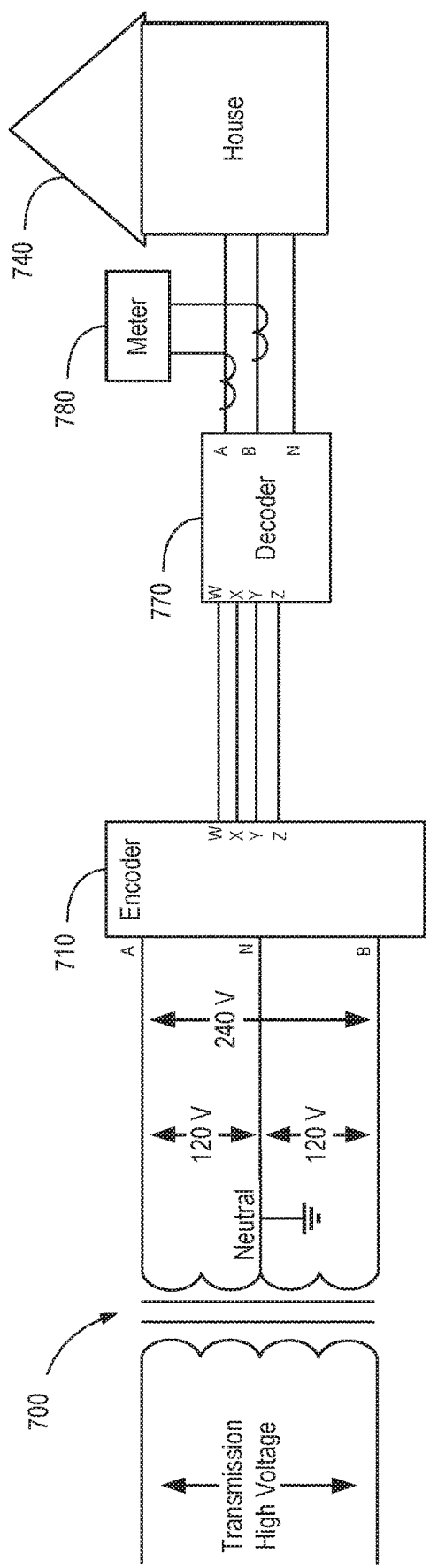
FIG. 7C illustrates four wires with encoded power, a decoder, and a meter, according to one embodiment.

FIG. 7C illustrates a decoder 770 added on in front of an existing meter 780. In various embodiments, an outside service panel of the house 740 (or other building) may include a mounting location for a traditional meter. The traditional meter 780 may be supplemented with a decoder 770. The decoder 770 may be physically positioned inside an existing or new service panel on the house 740, in a separate enclosure proximate the meter 780, and/or within an add-on enclosure encompassing an existing service panel for the meter 780 and the decoder 770.

Figure 7D:
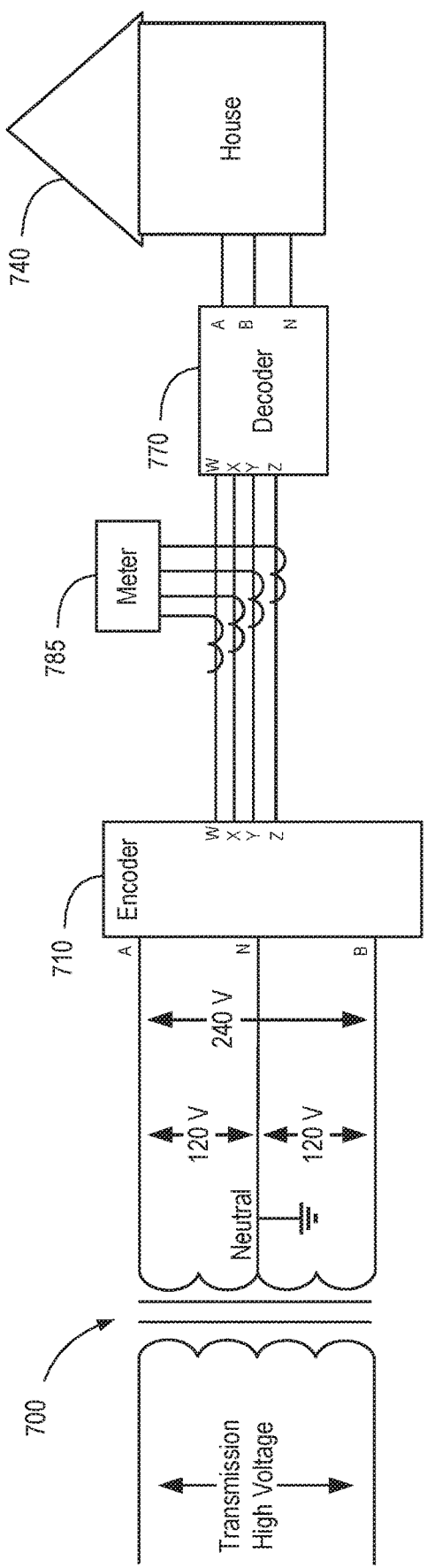
FIG. 7D illustrates four wires with encoded power, a meter between the encoder and decoder, and a decoder, according to an alternative embodiment.

FIG. 7D illustrates an alternative example in which the meter 785 is electrically in front of the decoder 770 with all four wires encoding the A-phase, the B-phase, and the neutral.

Figure 8:
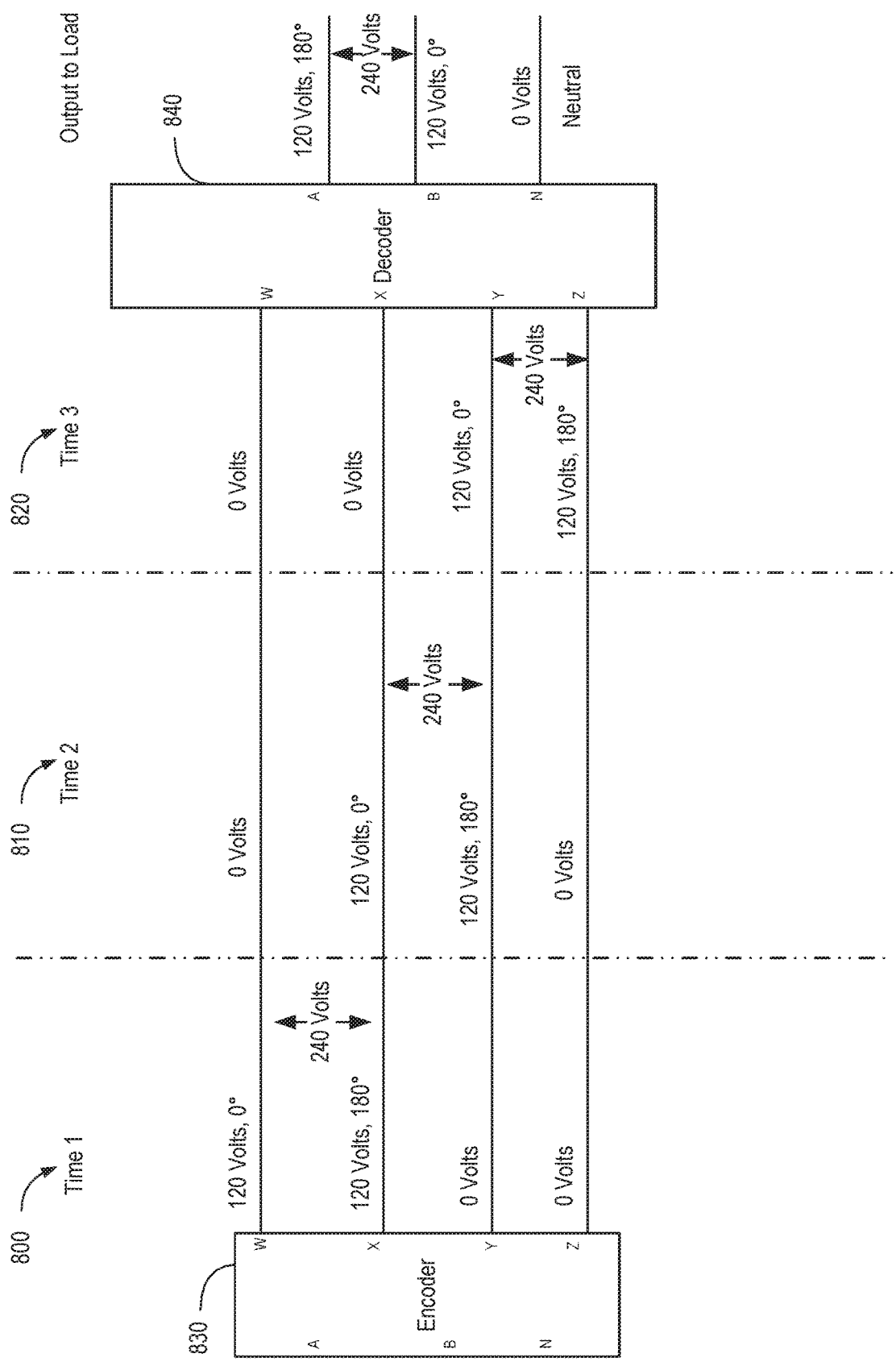
FIG. 8 illustrates four wires with encoded power in first, second, and third encoding rotations at first, second, and third times, respectively, according to one embodiment.

FIG. 8 illustrates four wires with encoded power in first, second, and third encoding rotations at first, second, and third times, respectively, according to one embodiment. The time-varying rotation of the Phases and neutral is independent of the frequency at which they are transmitted (or optionally related on a multi- or partial-cycle basis). Thus, Time 1 800 illustrates an instantaneous voltage during a time period at which the W-wire is encoded by the encoder 830 to carry 120 V at a reference angle (0°) and the X-wire is encoded to carry 120 V at an opposite angle (180°), such that the instantaneous voltage between the W-wire and the X-wire is 240 V. The Y-wire and the Z-wire may both be used as neutral, or one of them may be used as neutral and the other unused, grounded, used to detect inappropriate use, and/or used for communication.

Because the Time 1 800 relates to the time-varying rotational encoding and not necessarily the frequency of transmission, multiple cycles (or perhaps only partial cycles)

of power may occur during Time 1 800. For example, Time 1 800 may include one cycle, tens of cycles, or even hundreds of cycles at 50 Hz or 60 Hz. In some embodiments, the encoder and decoder may further encode the frequency of distribution. For example, the input to encoder 830 may be at 60 Hz, but the power may be upconverted (e.g., 120 Hz) or downconverted (e.g., 30 Hz) for encoded distribution on the W, X, Y, and Z wires. The decoder 840 may decode the rotational encoding and/or revert the frequency back to 60 Hz.

During Time 2 810, the X-wire and Y-wire may be used for the A-phase and B-phase. During Time 3 820, the Y-wire and the Z-wire may be used for the A-phase and the B-phase. In some embodiments, the transition of the A-phase and the B-phase between the X, Y, and Z wires may have some overlap (e.g., for a partial cycle, a single cycle, or a couple of cycles) during each rotation. For example, the A-phase may be on the X-wire during a first time period and about to transition to the Y-wire for a second time period (while the B-phase remains on the Z-wire). For a partial cycle (e.g., a 60 HZ cycle), a full cycle, or multiple cycles, the A-phase may be energized on both the X-wire and the Y-wire as the encoder rotates the phase from the first time period to the second time period.

Figure 9A:
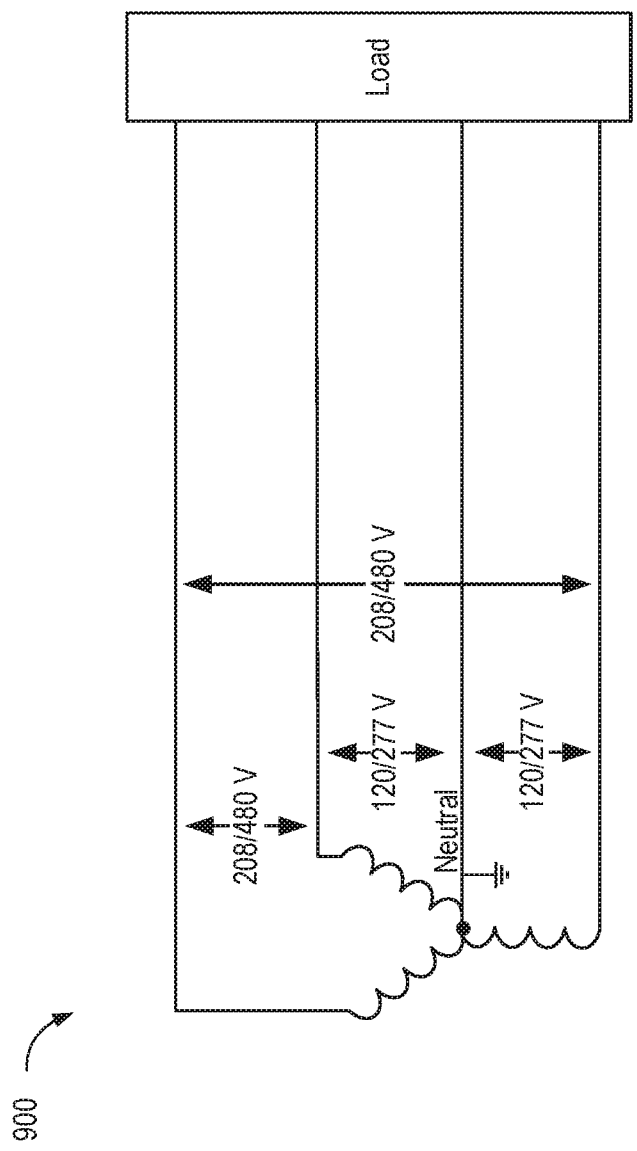
FIG. 9A illustrates a simplified diagram of three-phase power distribution from a 208/120V transformer to a load, according to one embodiment.

FIG. 9A illustrates a simplified diagram of three-phase power distribution 900 from a three-wire 208/120 V or 480/277 V transformer to a load, according to one embodiment.

Figure 9B:
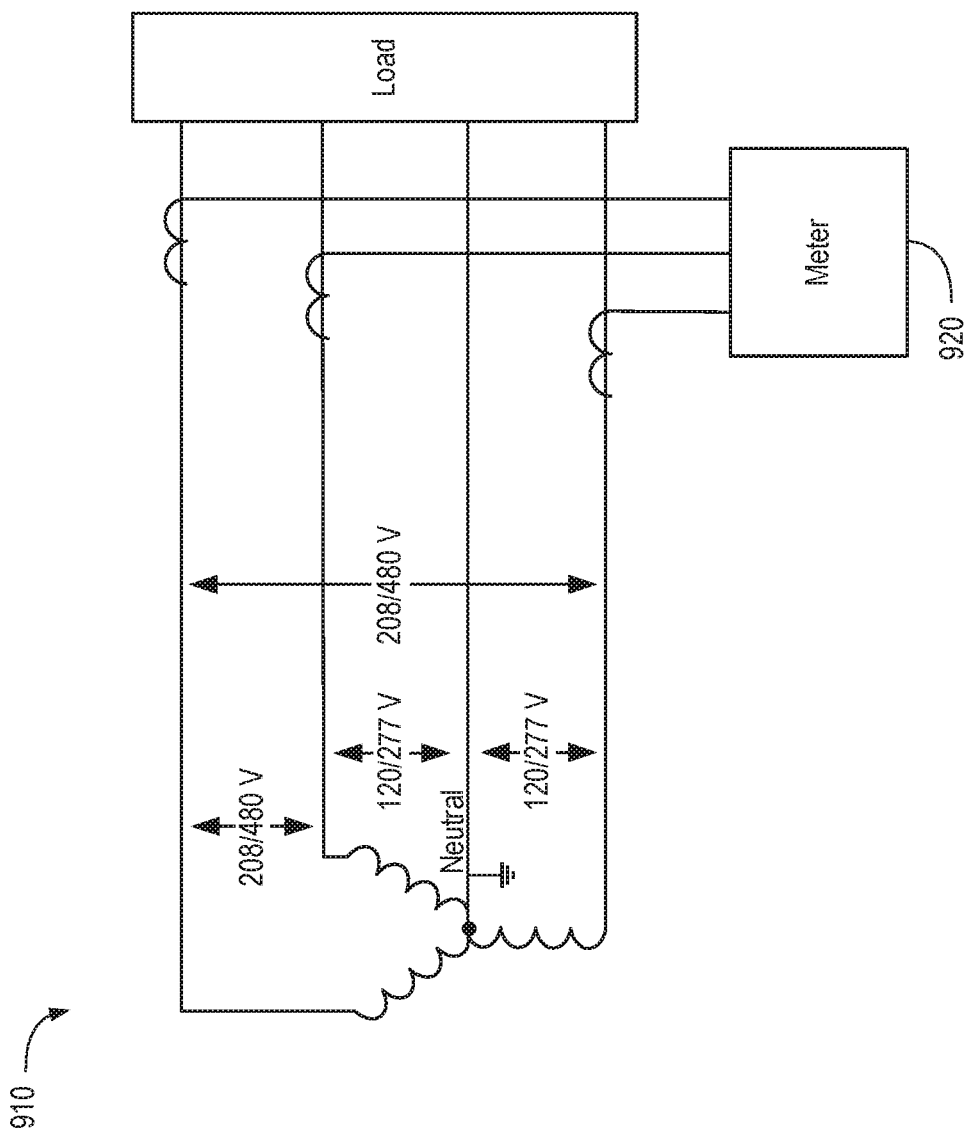
FIG. 9B illustrates a simplified diagram of three-phase power distribution from a 208/120V transformer to a metered load, according to one embodiment.

FIG. 9B illustrates a simplified diagram of three-phase power distribution 910 from a three-wire 208/120 V or 480/277 V transformer to a load metered by meter 920, according to one embodiment.

Figure 10A:
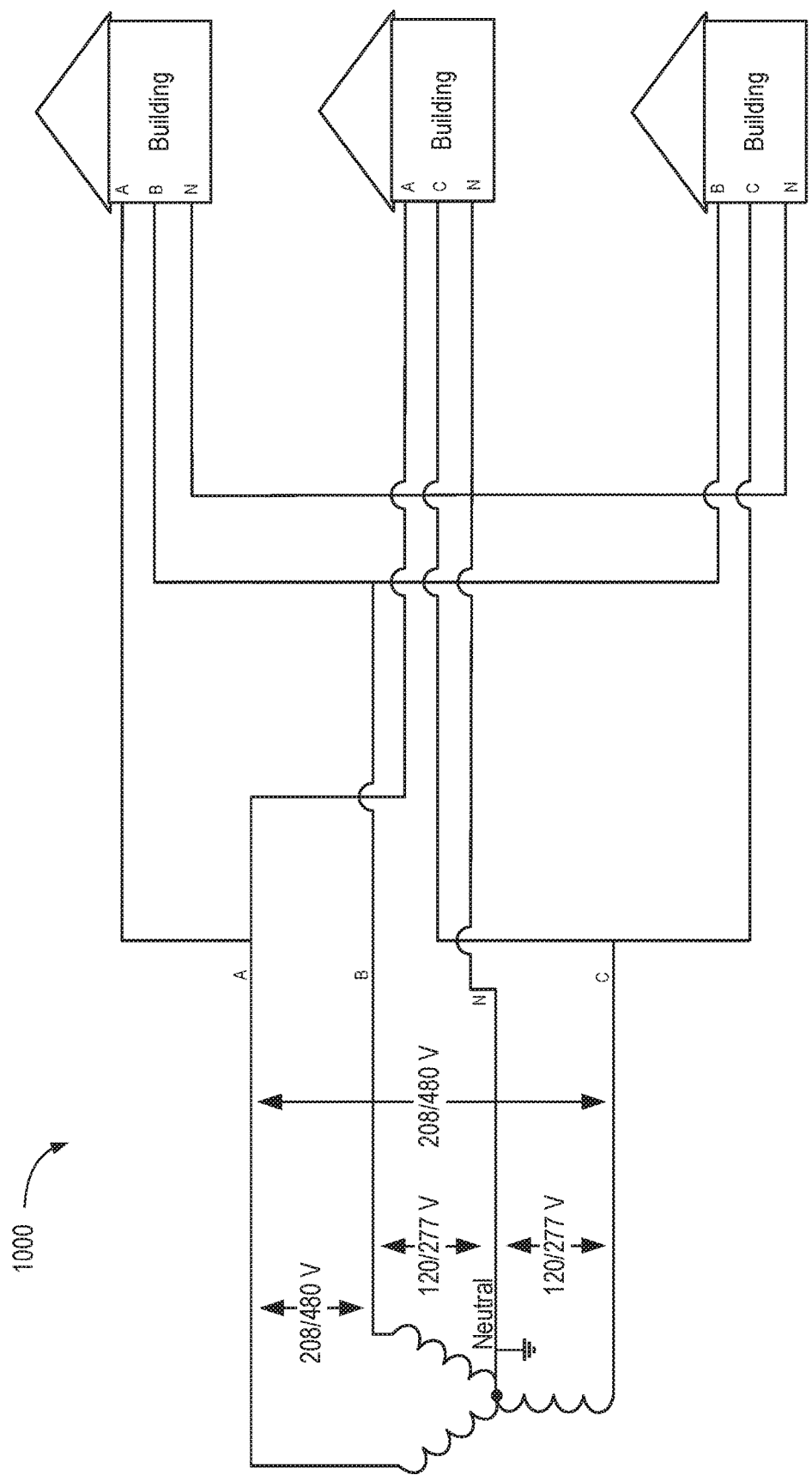
FIG. 10A illustrates a simplified diagram of one embodiment of balanced distribution of three-wire 208/120 V or 480/277 V single-phase power to buildings, according to one embodiment.

FIG. 10A illustrates a simplified diagram of one embodiment of balanced distribution 1000 of three-wire 208/120 V (or alternatively 480/277 V) single-phase power to buildings, according to one embodiment. As illustrated, each building receives two phases of power and a neutral. The difference between each phase of power and the neutral is 120 V (or 277 V). The difference between two phases of power is 208 V (or 480 V). Thus, each building can directly (i.e., without further transformation) use single-phase 208 V power and single-phase 120 V power (or single-phase 480 V power and single-phase 277 V power). There could be many more than three buildings to arrive at a statistically averaged balanced load.

Figure 10B:
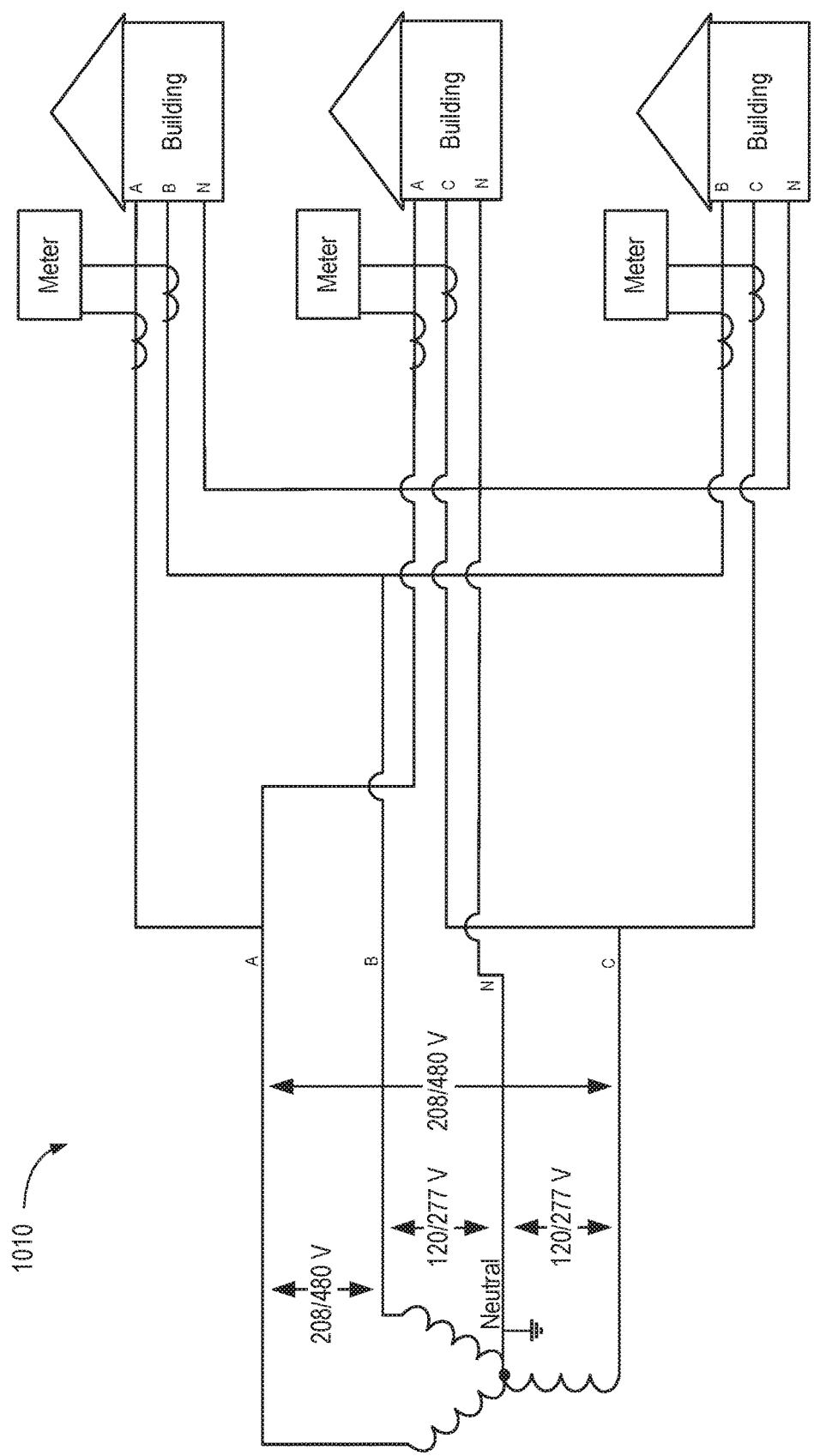
FIG. 10B illustrates a simplified diagram of one embodiment of balanced distribution of three-wire 208/120 V or 480/277 V single-phase power to metered buildings, according to one embodiment.

FIG. 10B is similar to that described in conjunction with FIG. 10A, except that each building is metered.

Figure 11A:
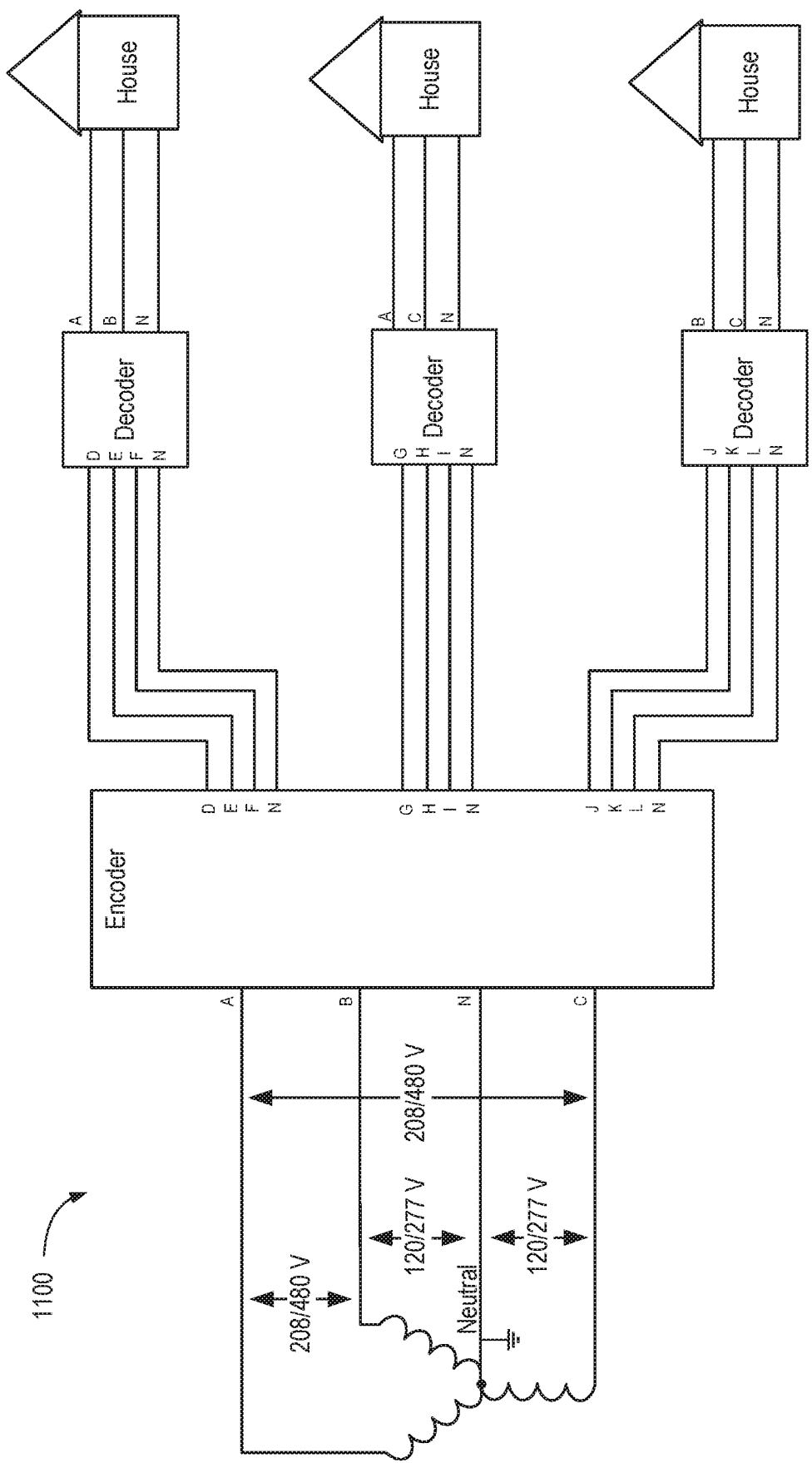
FIG. 11A illustrates encoded distribution of balanced three-wire 208/120V or 480/277V single-phase power to buildings using three-wire encoding, according to one embodiment.

FIG. 11A illustrates encoded distribution 1100 of balanced distribution of three-wire 208/120 V or 480/277 V single-phase power to buildings using four-wire encoding, according to one embodiment. The encoder can encode two phases for distribution to each building onto three wires and also pass through a neutral. The decoder can decode the two phases on the three wires for consumption. Any of the schemes for encoding and decoding described herein can be utilized. In some embodiments, all three wires distributed to each building may be encoded (i.e., the neutral may be encoded rather than passed through).

It is appreciated that for distribution configurations that provide three-phase delta service to a load (i.e., no neutral wire is run), three phases of power may be encoded and decoded using four wires. Alternatively, for three-phase delta service, one phase may be passed through and the other two phases may be encoded on three wires. Still further embodiments include two or three phases being rotationally encoded on three wires. For example, A-phase, B-phase, and C-phase may be rotationally encoded on the X-wire, Y-wire, and Z-wire. Because of the rotational encoding, attempts to use the encoded X-wire, Y-wire, and Z-wire without decoding would result in problematic phase differences between each of the wires.

Figure 11B:
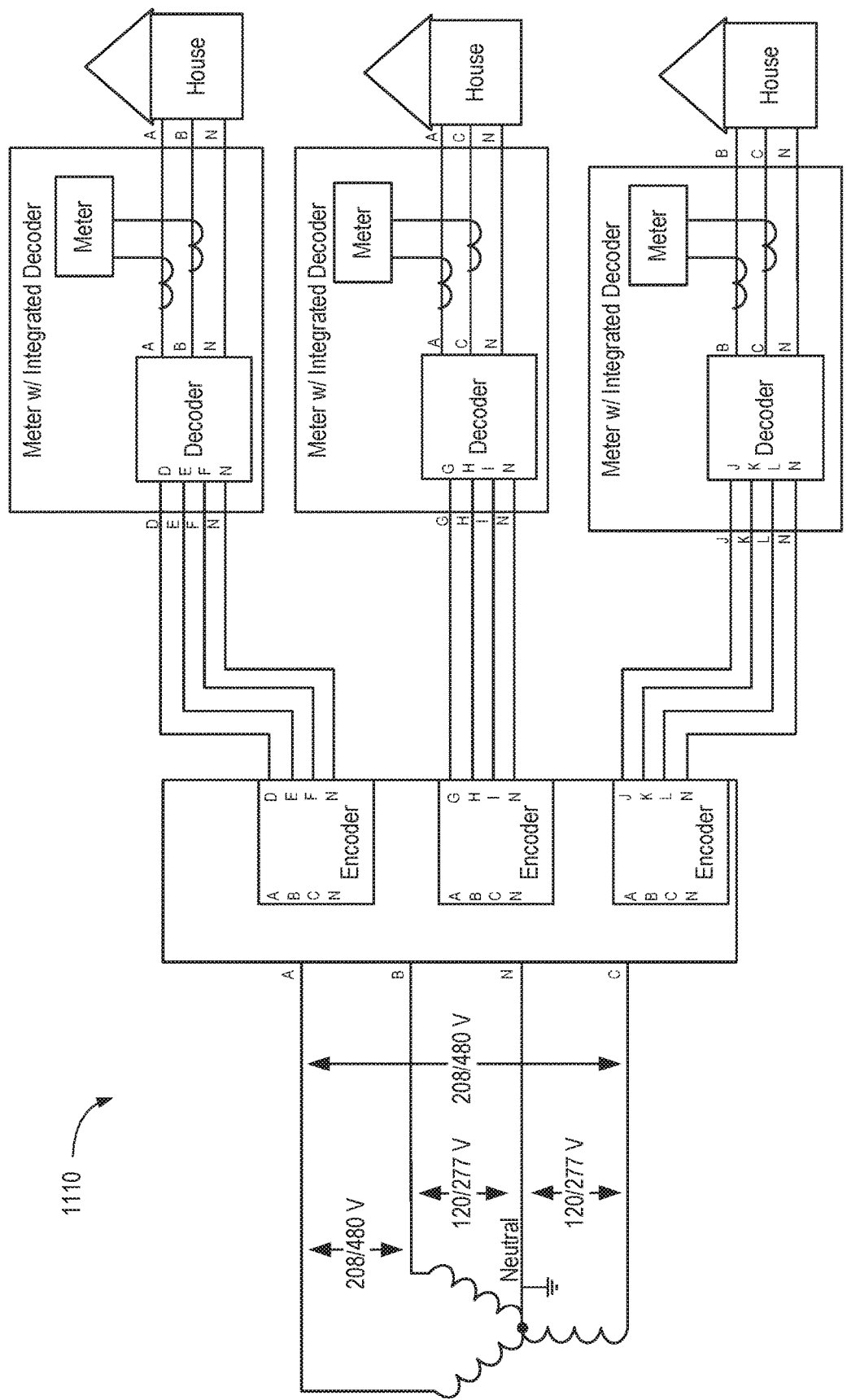
FIG. 11B illustrates encoded distribution of balanced distribution of three-wire 208/120V or 480/277V single-phase power to buildings using individual encoding with meters with integrated decoders, according to one embodiment.

FIG. 11B with system 1110 is similar to any of the embodiments described in conjunction with FIG. 11A, except that a combination meter/decoder system is used to decode and meter the power provided to each building, similar to the embodiments previously described. As described in conjunction with FIG. 4B and FIG. 6, the meter within each combination meter/decoder system may be positioned before and/or after the decoder for differing metering approaches and potential cost sharing. As illustrated, each house or group of houses using the same two phases for single-phase 208 V or 277 V may be associated with its own encoder within an encoding system.

Figure 11C:
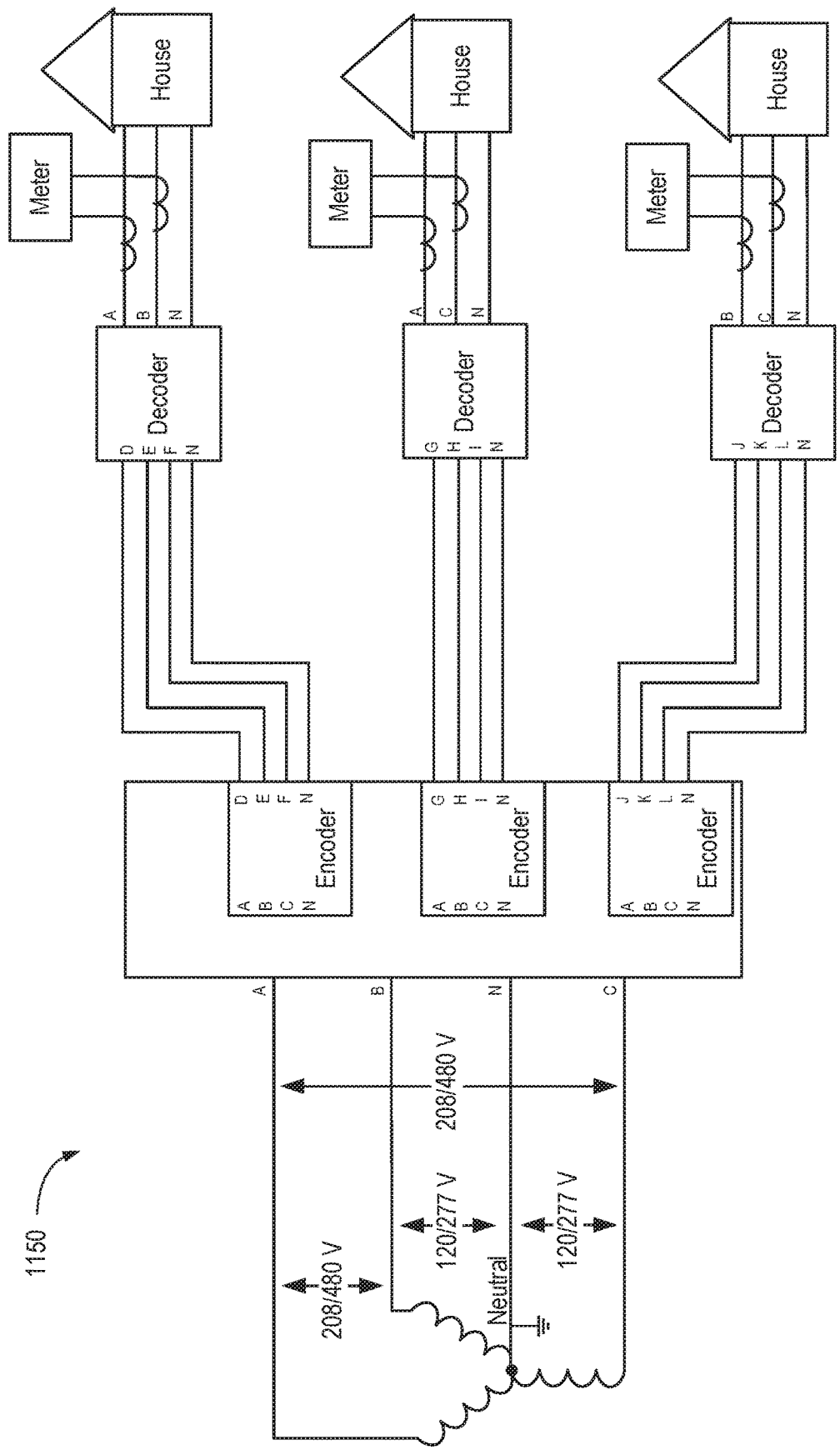
FIG. 11C illustrates an encoded distribution system with an existing or traditional meter in place and add-on decoders, according to one embodiment.

FIG. 11C with system 1150 is similar to some of the embodiments described in conjunction with FIG. 11A, except that an existing or traditional meter remains in place and an add-on decoder has been added to the system to decode the power provided to each house, similar to the embodiments previously described.

Figure 11D:
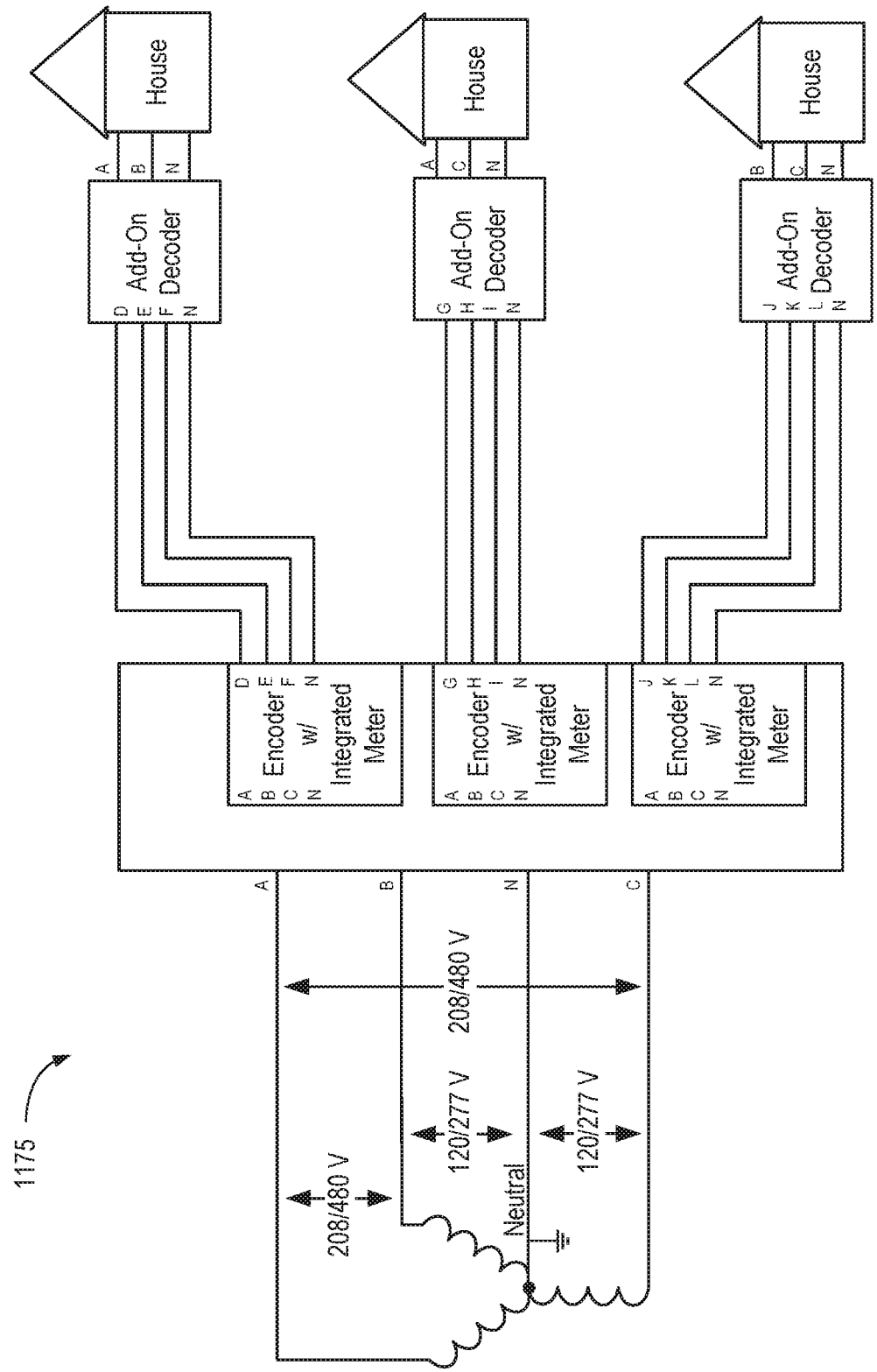
FIG. 11D illustrates yet another example of a system in which an add-on decoder is used proximate each house with a meter integrated within the encoder, according to one embodiment.

FIG. 11D illustrates yet another example of a system 1175 in which an add-on decoder is used proximate each house. In some embodiments, the add-on decoder may physically replace an existing meter in a house using the same service panel and connections. In the illustrated embodiment, each house has its own encoder so a meter may be integrated with the encoder (before or after actual encoding) to meter the power consumption of each house. In some embodiments, an integrated combination encoder/metering system may perform encoding for a group of houses but meter each one individually.

Figure 12A:
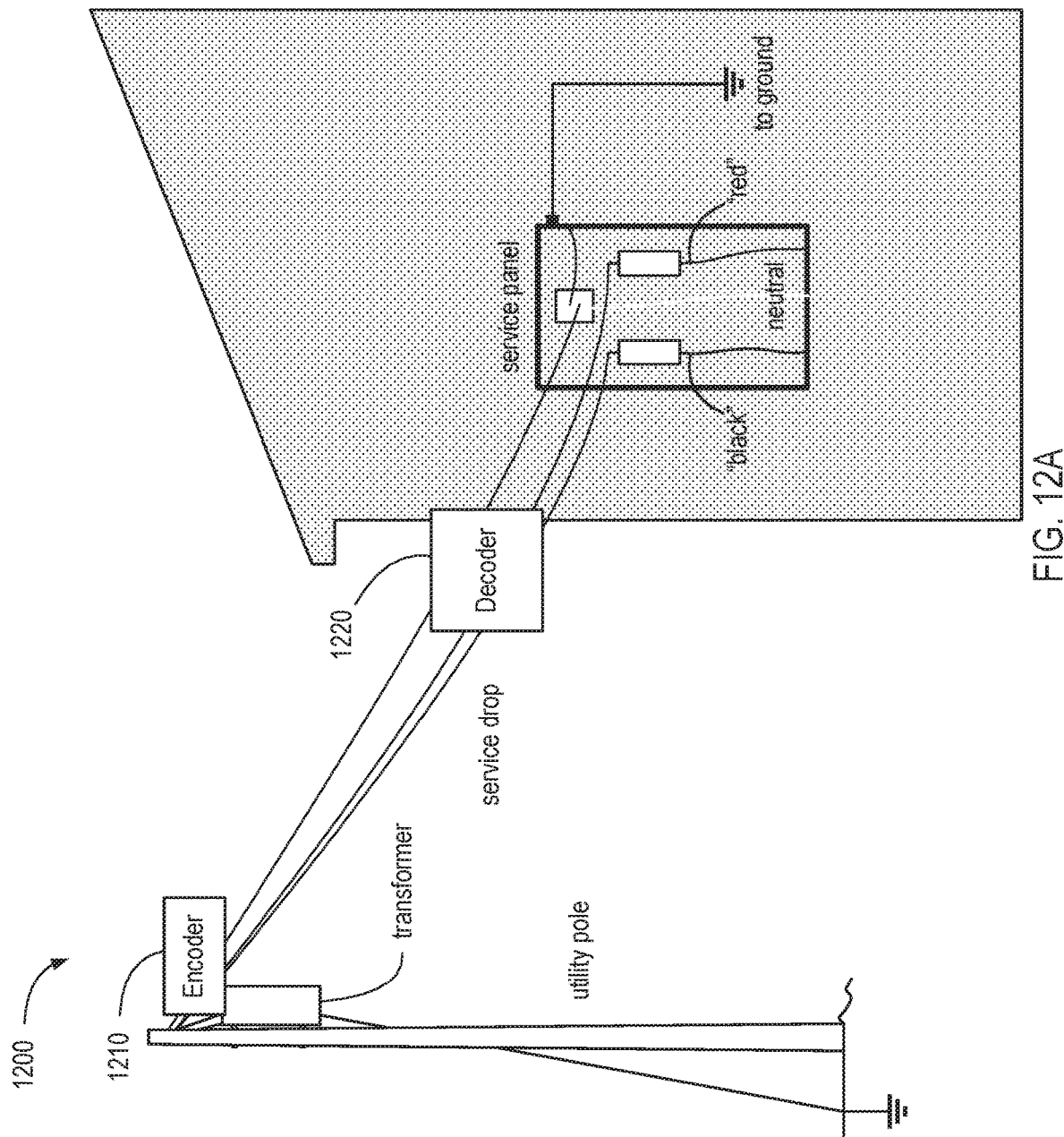
FIG. 12A illustrates a block diagram of a utility pole with a transformer and encoder distributing encoded split-phase 240/120V power to a decoder on a house for power distribution to a service panel therein, according to one embodiment.

FIG. 12A illustrates a block diagram 1200 of a utility pole with a transformer and encoder 1210 distributing encoded split-phase 240/120 V power to a decoder 1220 on a house for power distribution to a service panel therein, according to one embodiment. As previously described, the wires extending from the utility pole to the house are encoded, so the chance of theft is reduced.

Figure 12B:
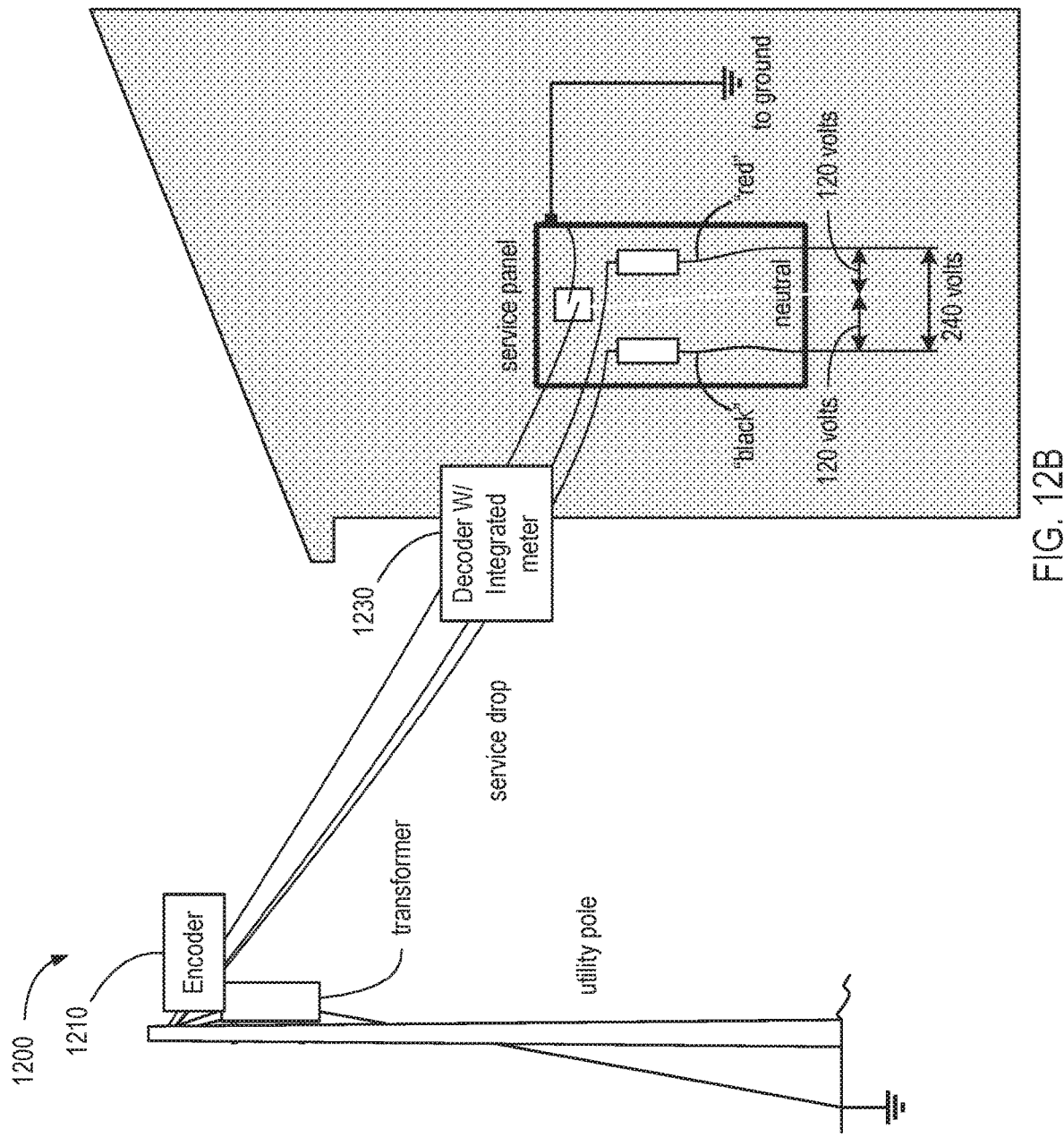
FIG. 12B illustrates a block diagram of a utility pole with a transformer and encoder distributing encoded split-phase 240/120V power to a decoder with an integrated meter on a house for power distribution to a service panel therein, according to one embodiment.

FIG. 12B illustrates a block diagram 1200 of a utility pole with a transformer and encoder 1210 distributing encoded split-phase 240/120 V power to a decoder with an integrated meter 1230 on a house for power distribution to a service panel therein, according to one embodiment. As previously described, the wires extending from the utility pole to the house are encoded, so the chance of theft is reduced since access to the utility pole is limited and/or access to the side of the house (inside or outside) may be easily detected.

Figure 12C:
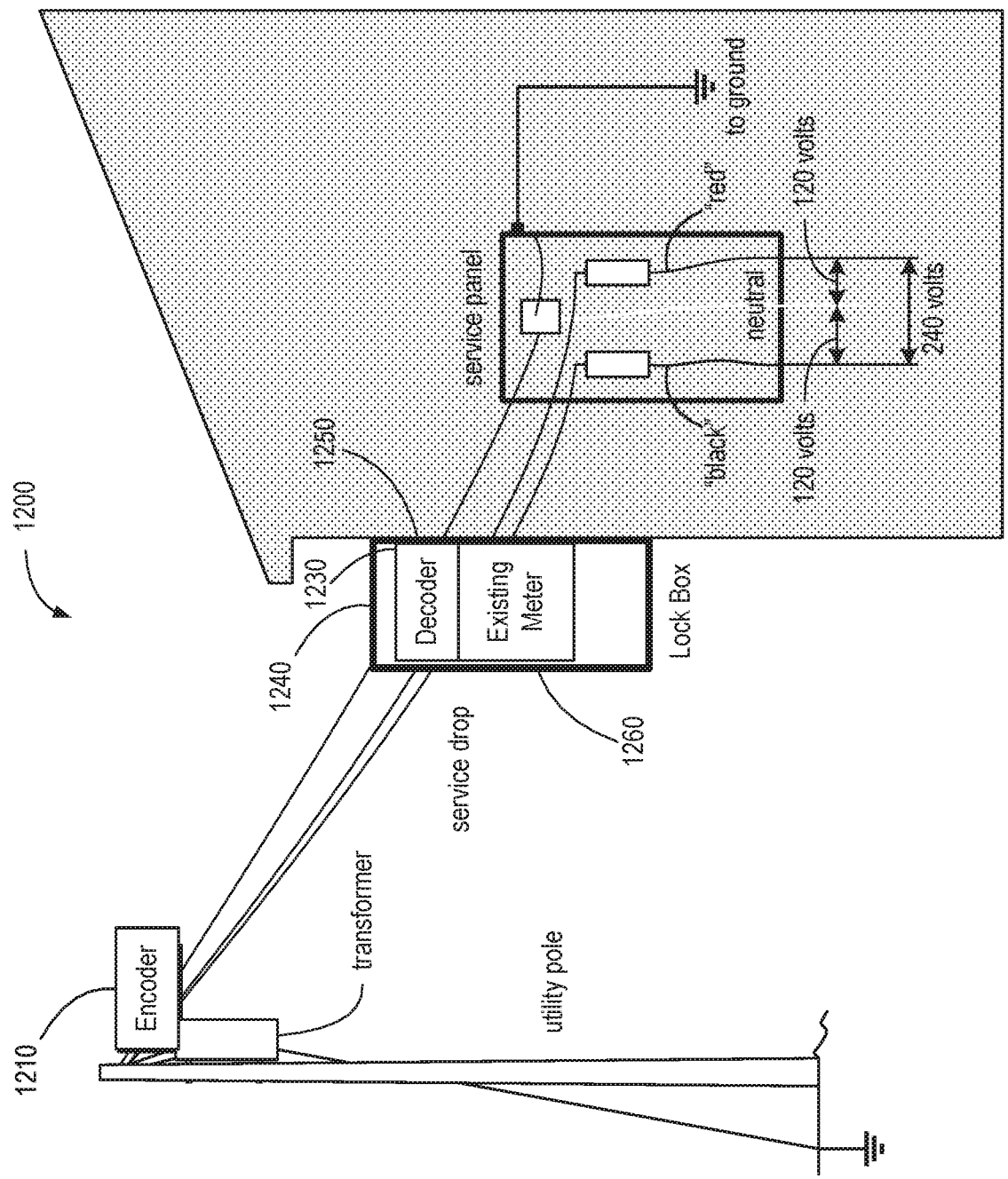
FIG. 12C illustrates a block diagram of a utility pole with a transformer and encoder distributing encoded split-phase 240/120V power to a decoder with an existing traditional meter on a house for power distribution to a service panel therein, according to one embodiment.

FIG. 12C illustrates an add-on decoder 1250 in connection with an existing meter 1260 encapsulated by a panel box 1240. In the illustrated embodiment, the decoder 1250 may be installed in front of (electrically) the existing meter 1260 without modification or with only minor modification (e.g., connections) to the existing service panel 1240 and meter 1260. In other embodiments, the decoder may be installed within the existing service panel (e.g., on the bus bars therein) similar to a breaker, in conjunction with the existing breaker, or with a service breaker incorporated into the decoder.

Figure 13A:
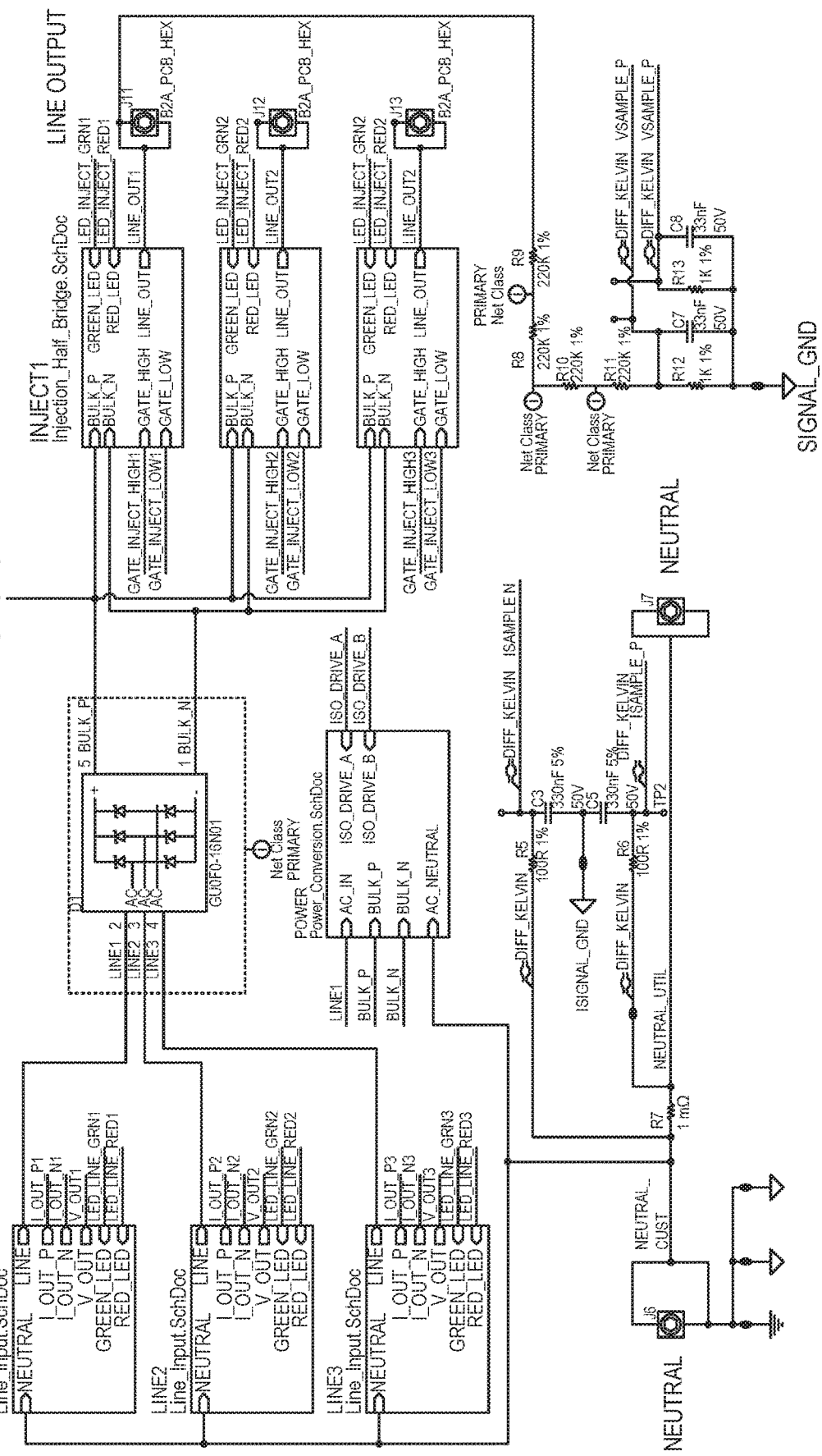
FIG. 13A illustrates an example schematic diagram of a portion of an encoder/decoder system for distribution of encoded electric power, according to one embodiment.

FIG. 13A illustrates an example schematic diagram 1300 of a portion of an encoder/decoder system for distribution of encoded electric power, according to one embodiment. While there are many ways to implement the concepts presented here, this embodiment is implemented using solid-state electronics and printed circuit board technology. A wide variety of alternative embodiments are possible and cannot possibly be exhaustively illustrated in this disclosure. The preceding systems and methods, as described in terms of functionality and results, may be implemented using any combination of hardware, firmware, and/or software, as appreciated by one of skill in the art.

Figure 13B:
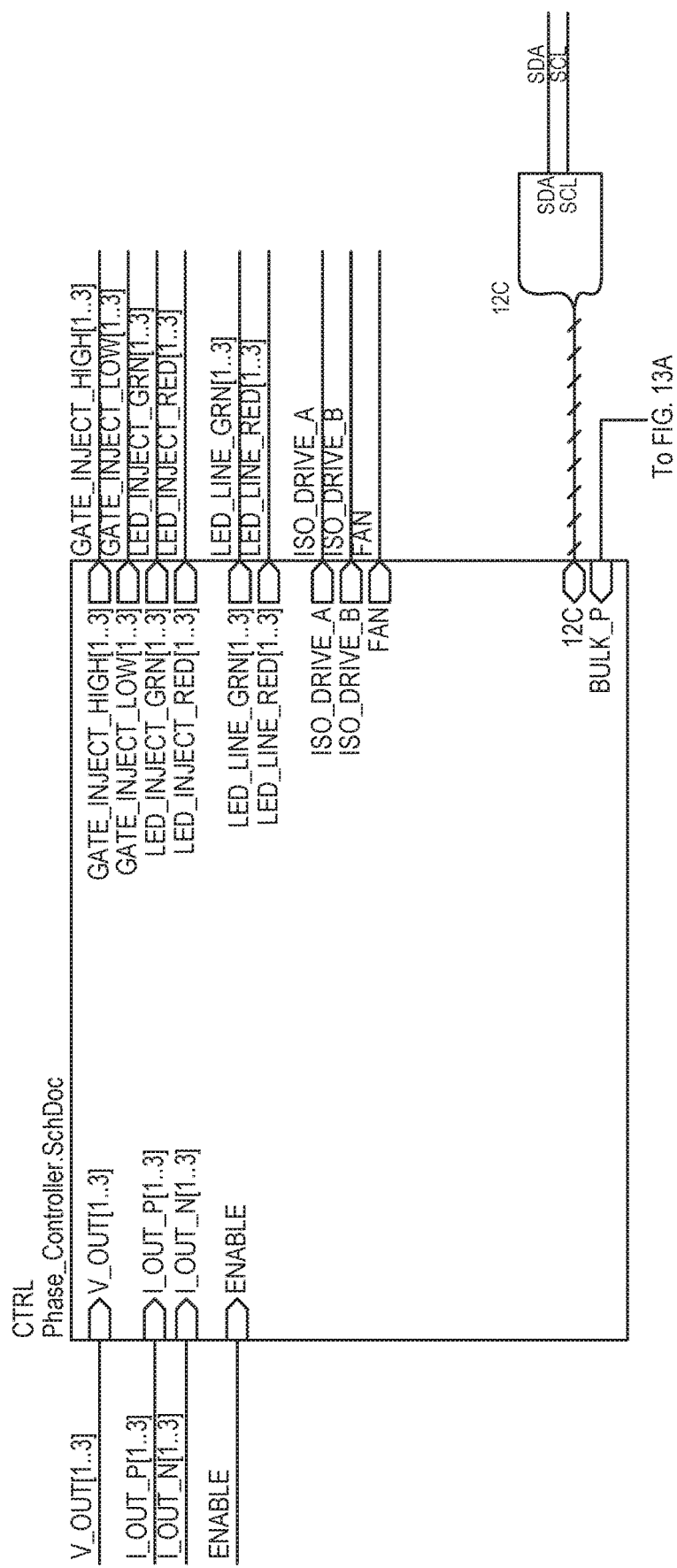
FIG. 13B illustrates an example schematic diagram of a phase controller portion of an encoder/decoder system for distribution of encoded electric power, according to one embodiment.

FIG. 13B illustrates an example schematic diagram of a phase controller portion of an encoder/decoder system for distribution of encoded electric power, according to one embodiment. The phase controller is an essential component for this embodiment of the encoder/decoder scheme. Other embodiments may omit this module.

Figure 13C:
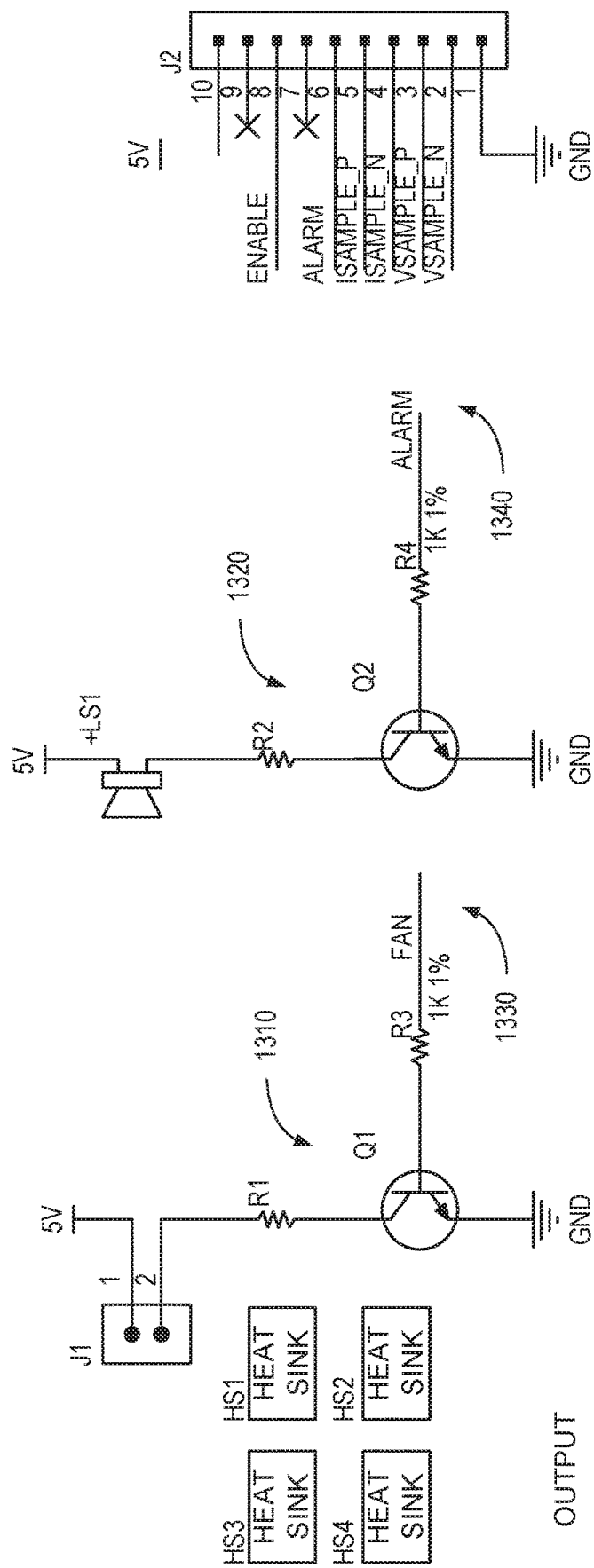
FIG. 13C illustrates an example schematic diagram of physical and electronic components that are part of an encoder/decoder system for distribution of encoded electric power, according to one embodiment.

FIG. 13C illustrates an example schematic diagram of physical and electronic components that are part of this embodiment of the encoder/decoder system for distribution of encoded electric power. The transistors 1310 and 1320 function as amplifiers that enable a low current output of a microcontroller to drive physical devices such as a fan 1330 and/or an alarm speaker 1340.

Figure 13D:
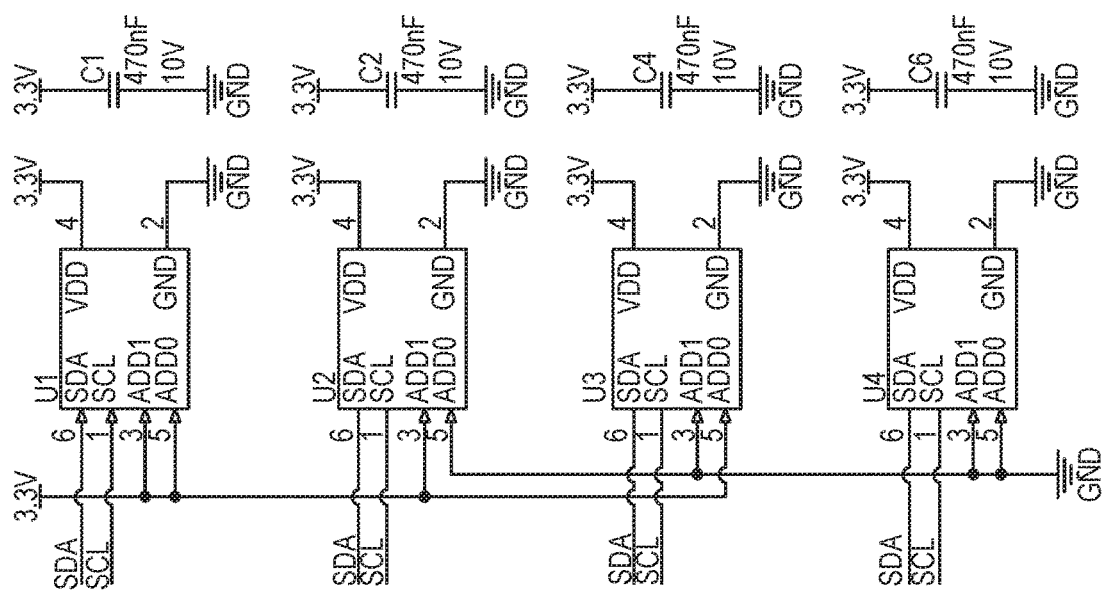
FIG. 13D illustrates an example schematic diagram of four circuit board temperature sensors to facilitate monitoring of an encoder/decoder system for distribution of encoded electric power, according to one embodiment.

FIG. 13D illustrates an example schematic diagram of four circuit board temperature sensors to facilitate monitoring of this embodiment of the encoder/decoder system for distribution of encoded electric power.

Figure 14A:
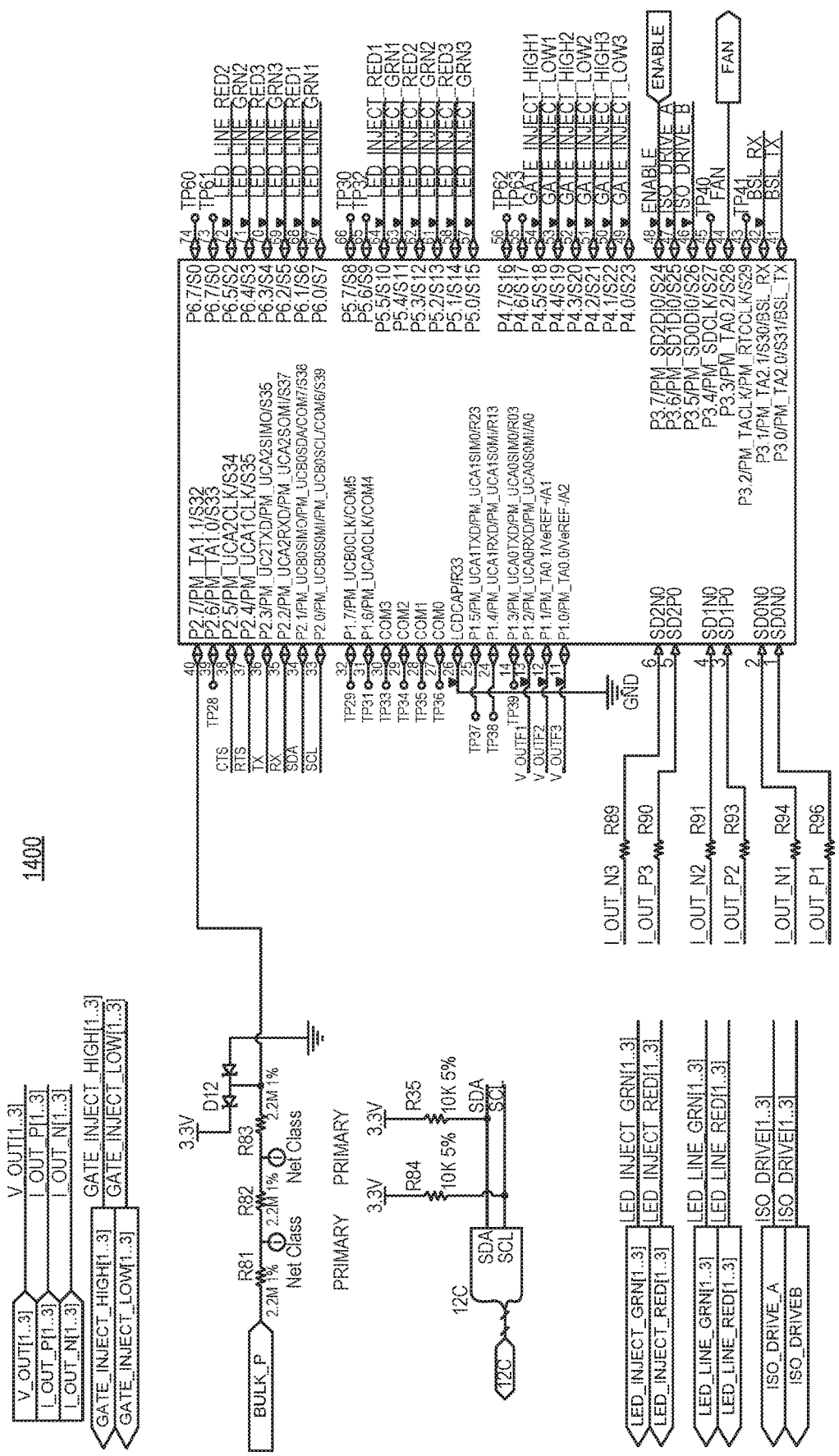
FIG. 14A illustrates an example schematic diagram of a microcontroller system and its myriad of inputs and outputs to control an encoder/decoder system for distribution of encoded electric power, according to one embodiment.
Figure 14B:
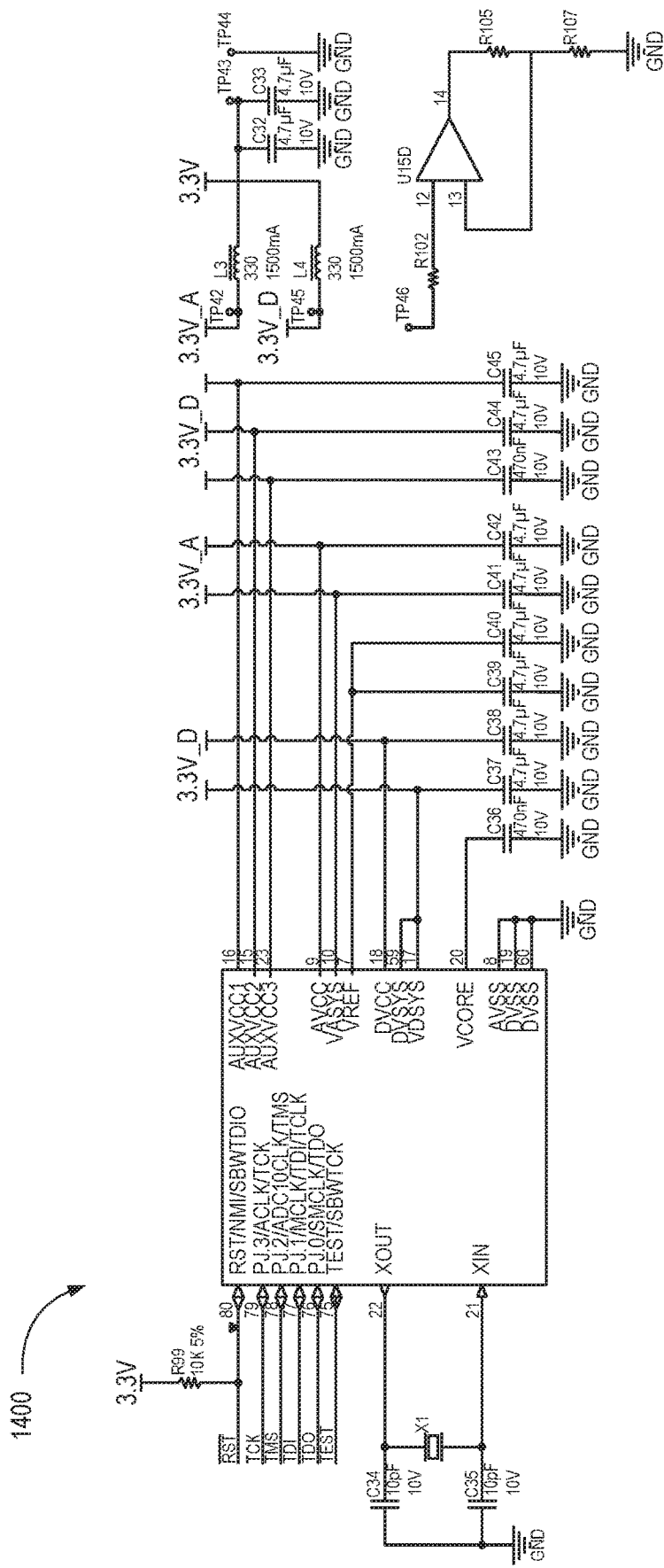
FIG. 14B illustrates additional input and output control lines of the microcontroller illustrated in FIG. 14A.

FIGS. 14A and 14B illustrate an example schematic diagram of a microcontroller-based system to control the encoder/decoder system for distribution of encoded electric power. While other components such as FPGAs, PLDs, and/or discrete logic could be used to control the system, a microcontroller implementation and associated software are reliable, flexible and inexpensive. The illustrated embodiment includes a myriad of inputs and outputs for controlling an encoder/decoder system. Alternative embodiments may include more or fewer inputs and/or outputs and may include more or less monitoring of system conditions.

Figure 14C:
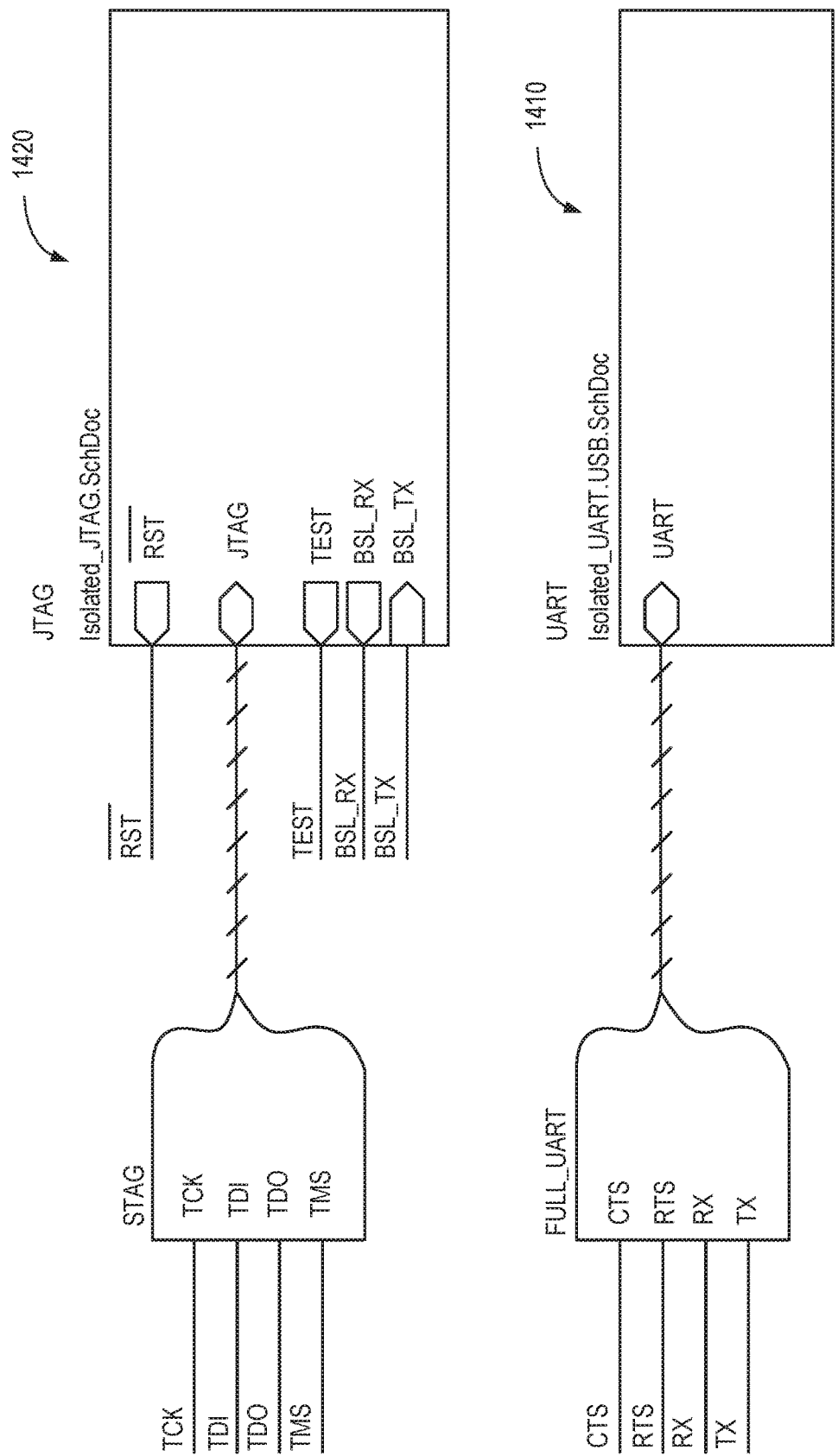
FIG. 14C illustrates an example schematic diagram of a universal asynchronous transmitter/receiver (UART) interface and a JTAG testing interface for an encoder/decoder system for distribution of encoded electric power, according to one embodiment.

FIG. 14C illustrates an example schematic diagram of a universal asynchronous transmitter/receiver (UART) interface 1410 and a JTAG testing interface 1420 for an encoder/decoder system for distribution of encoded electric power, according to one embodiment. These modules facilitate the programming, debugging and communication with the encoder/decoder system.

Figure 14D:
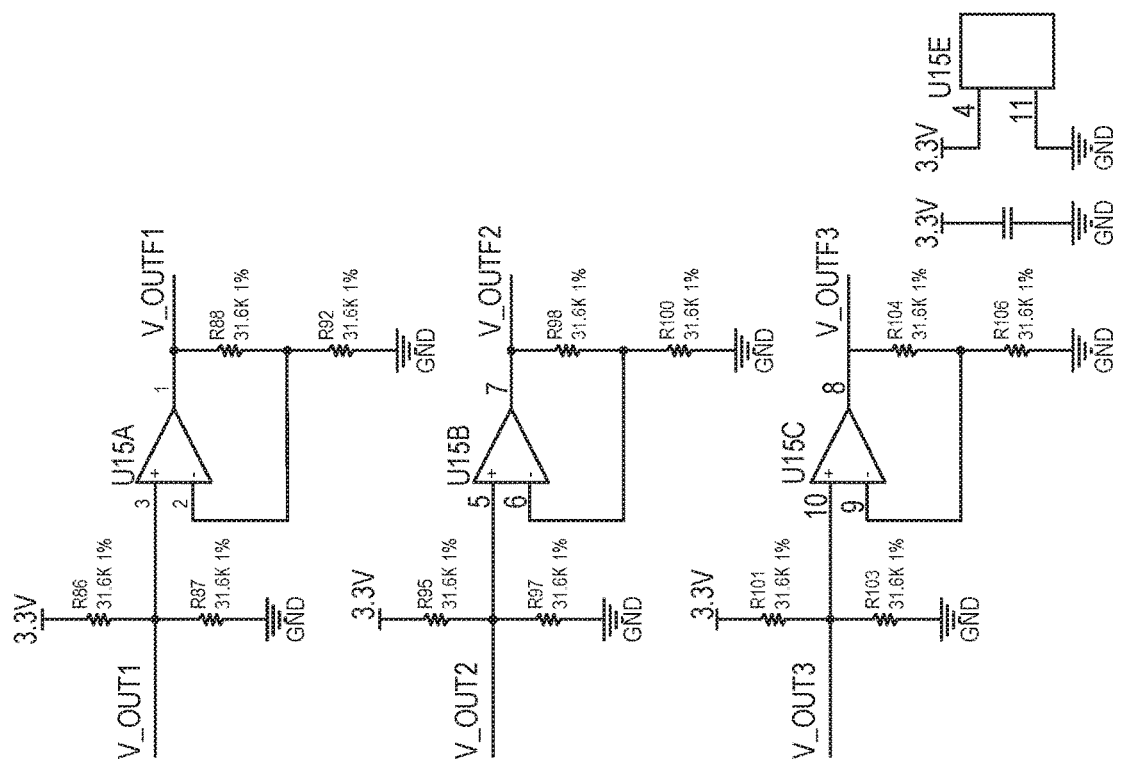
FIG. 14D illustrates an example schematic diagram of non-inverting summing amplifiers used to control an encoder/decoder system for distribution of encoded electric power, according to one embodiment.

FIG. 14D illustrates an example schematic diagram of non-inverting summing amplifiers used to control an encoder/decoder system for distribution of encoded electric power, according to one embodiment.

Figure 15A:
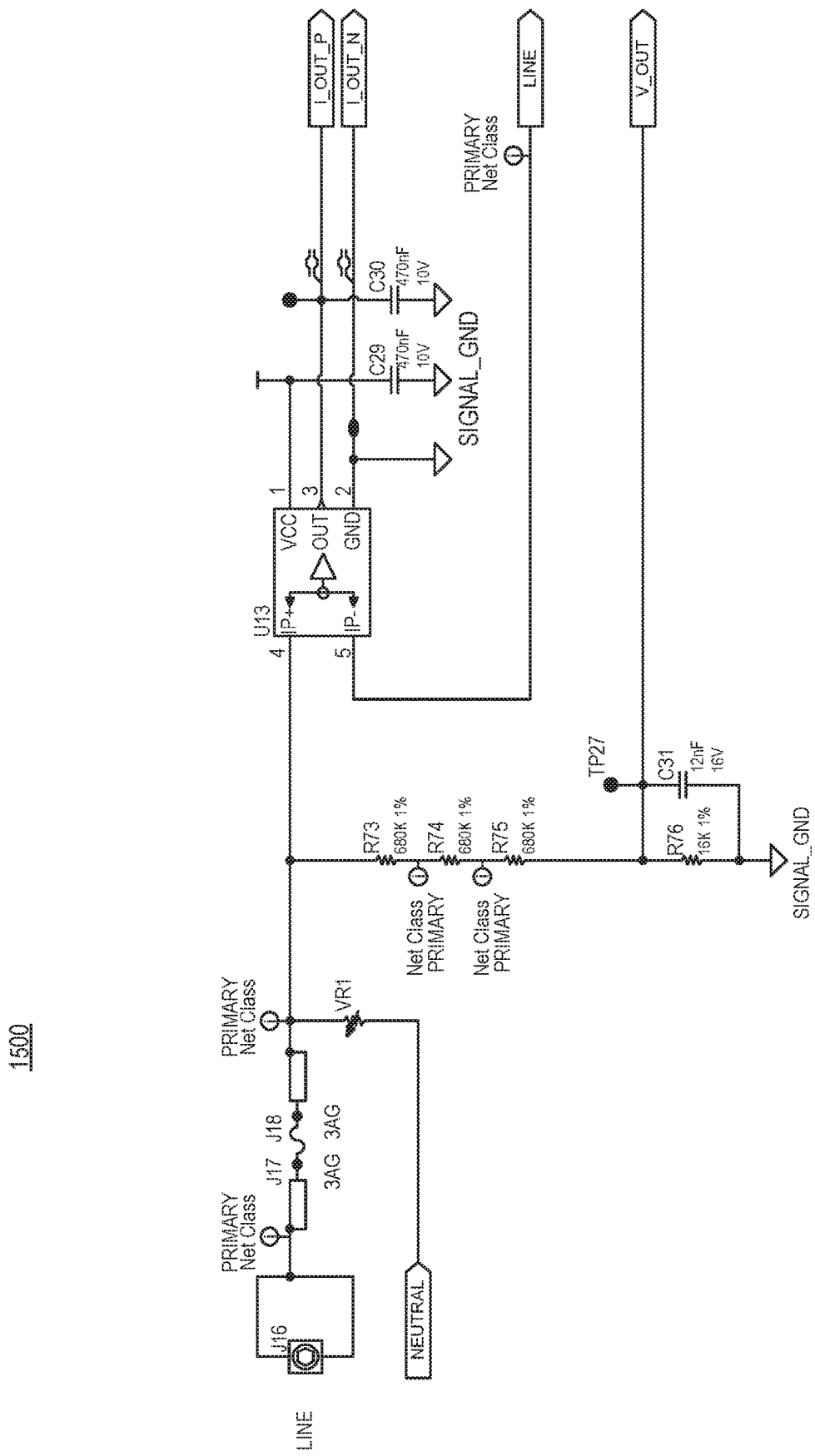
FIG. 15A illustrates an example schematic diagram of current sensors to control an encoder/decoder system for distribution of encoded electric power, according to one embodiment.

FIG. 15A illustrates an example schematic diagram of current sensors required to control an encoder/decoder system for distribution of encoded electric power, according to one embodiment.

Figure 15B:
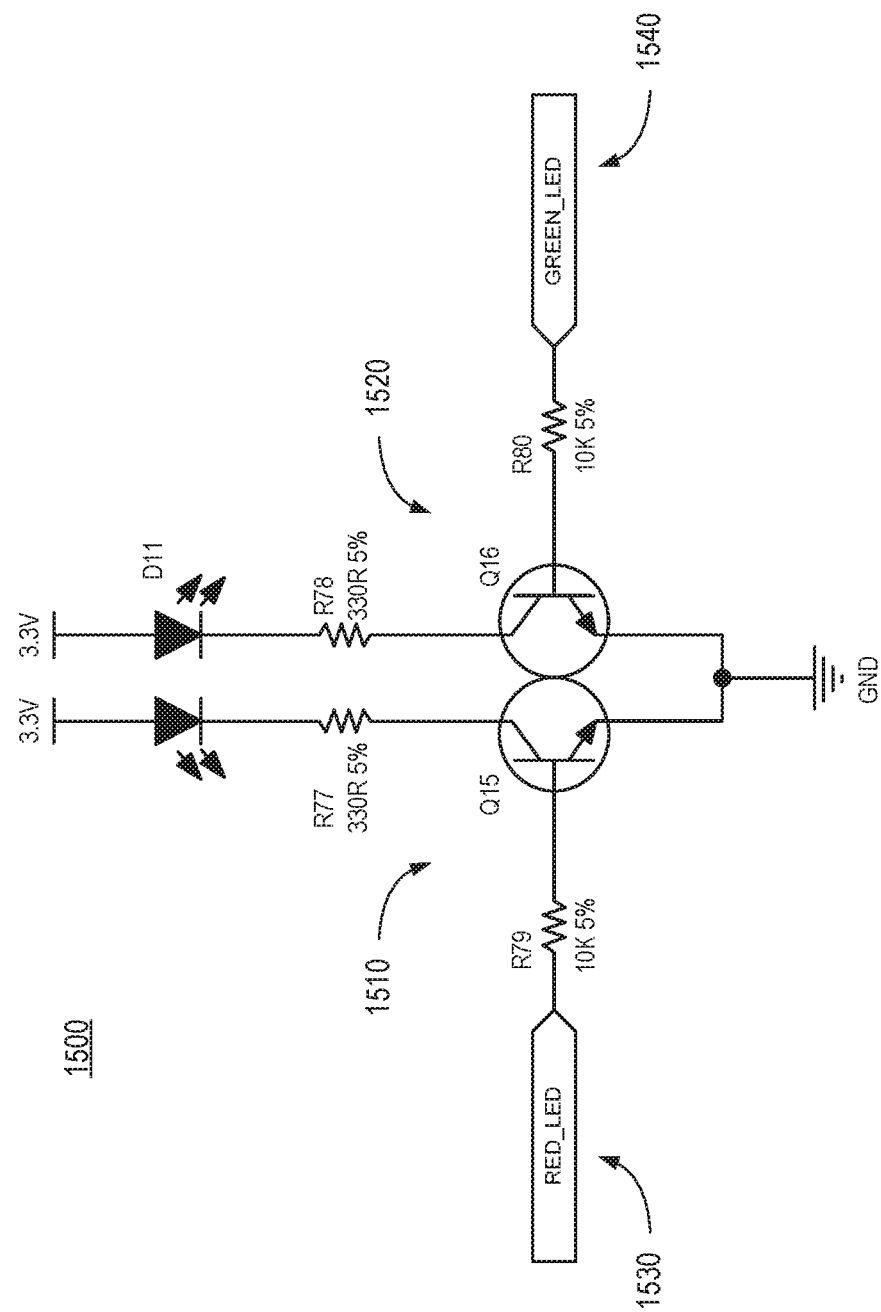
FIG. 15B illustrates an example schematic diagram of simple transistor amplifiers used to enable light emitting diodes to be driven on or off via a low drive microcontroller output to control an encoder/decoder system for distribution of encoded electric power, according to one embodiment.

FIG. 15B illustrates an example schematic diagram of simple transistor amplifiers used to enable light emitting diodes (LEDs) to be driven on or off via a low drive microcontroller output to control an encoder/decoder system for distribution of encoded electric power, according to one embodiment. These simple amplifiers are similar to those described in FIG. 13C. Transistors 1510 and 1520 allow a low current microcontroller output to drive LEDs 1530 and 1540 respectively. These LEDs indicate status of the encoder/decoder system.

Figure 16:
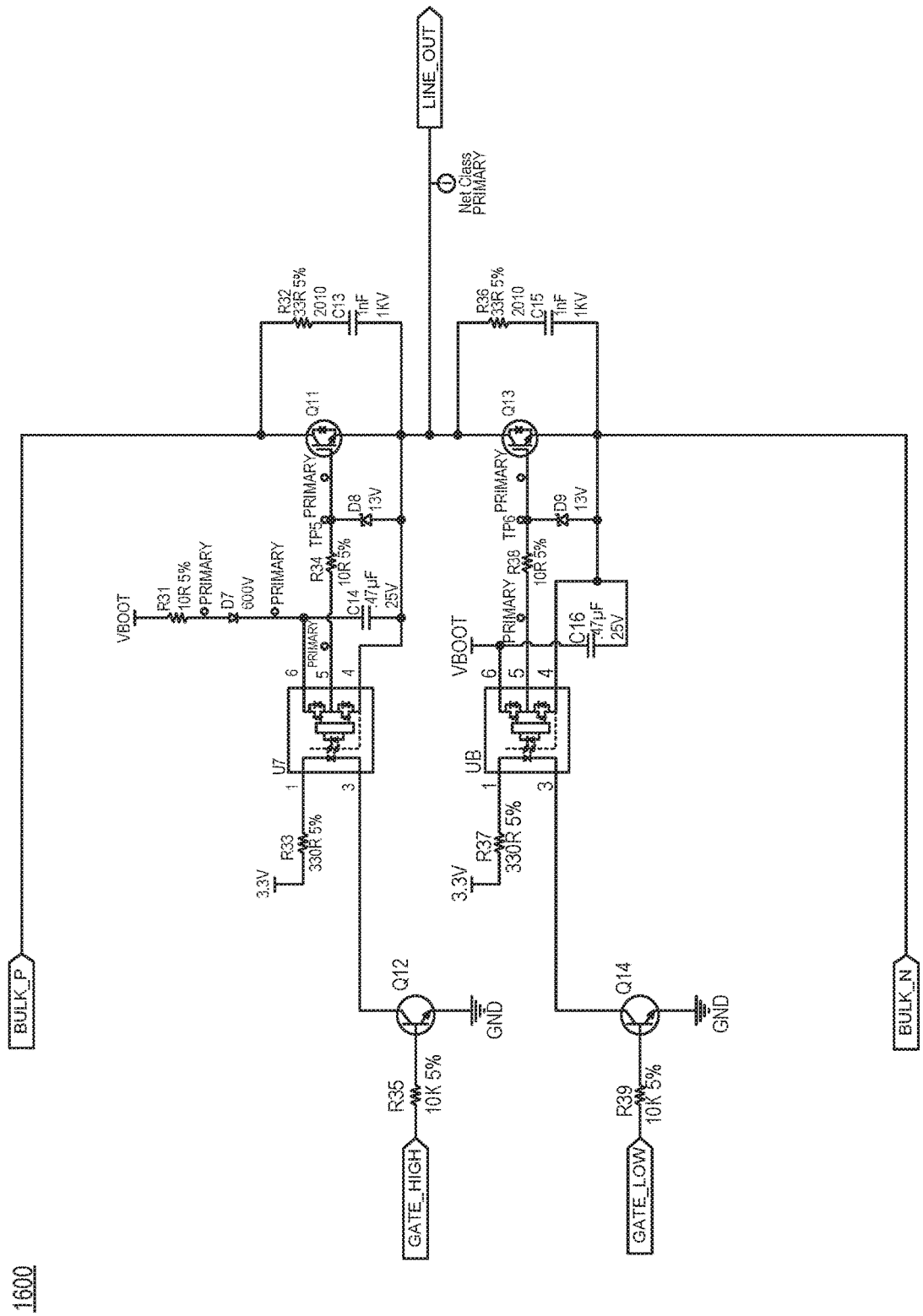
FIG. 16 illustrates an example schematic diagram of an optically isolated power-switching module of an encoder/decoder system for distribution of encoded electric power, according to one embodiment.
Figure 17A:
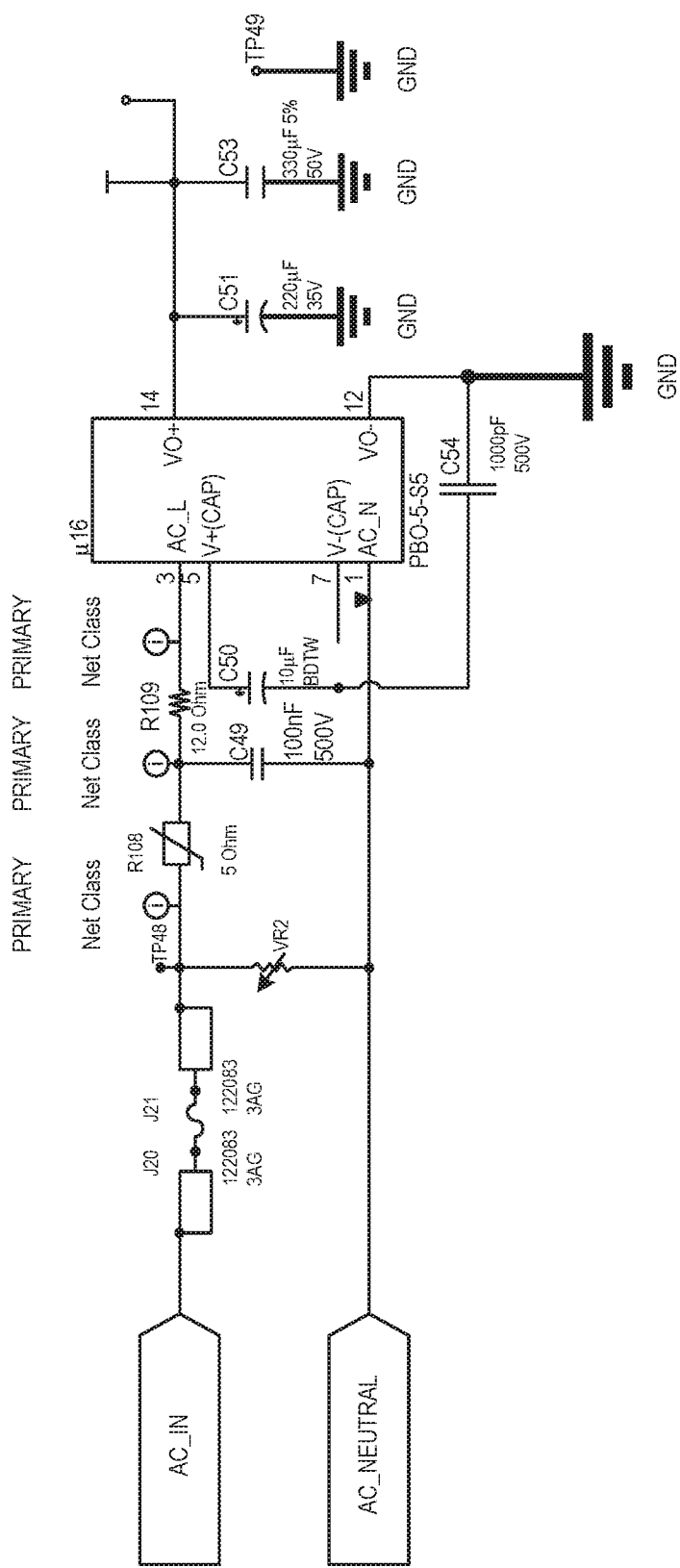
FIG. 17A illustrates an example schematic of a 5 V power supply that is one portion of the encoder/decoder system for distribution of encoded electric power, according to one embodiment.
Figure 17B:
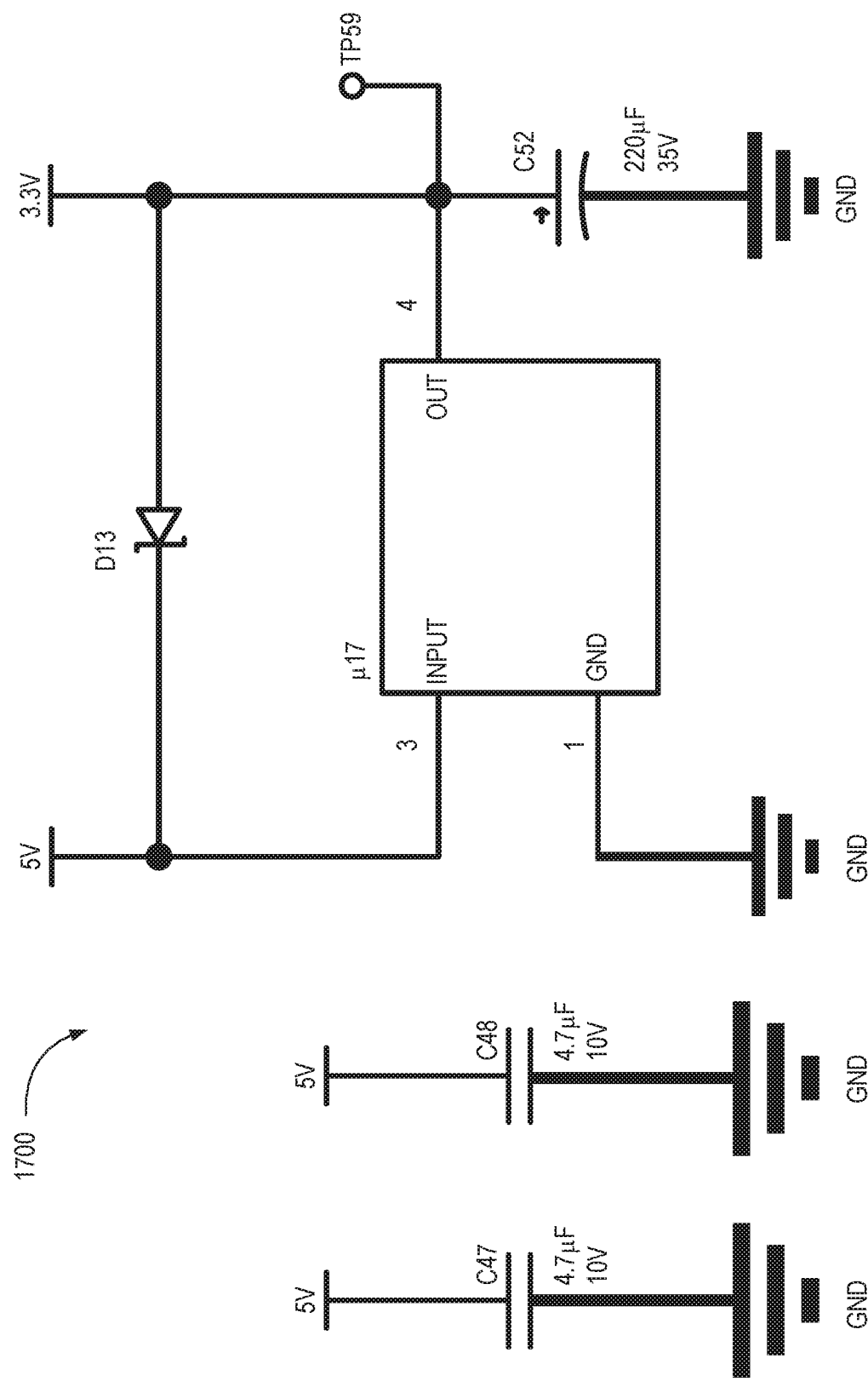
FIG. 17B illustrates an example schematic of a 3.3 V power supply that is one portion of the encoder/decoder system for distribution of encoded electric power, according to one embodiment.
Figure 17C:
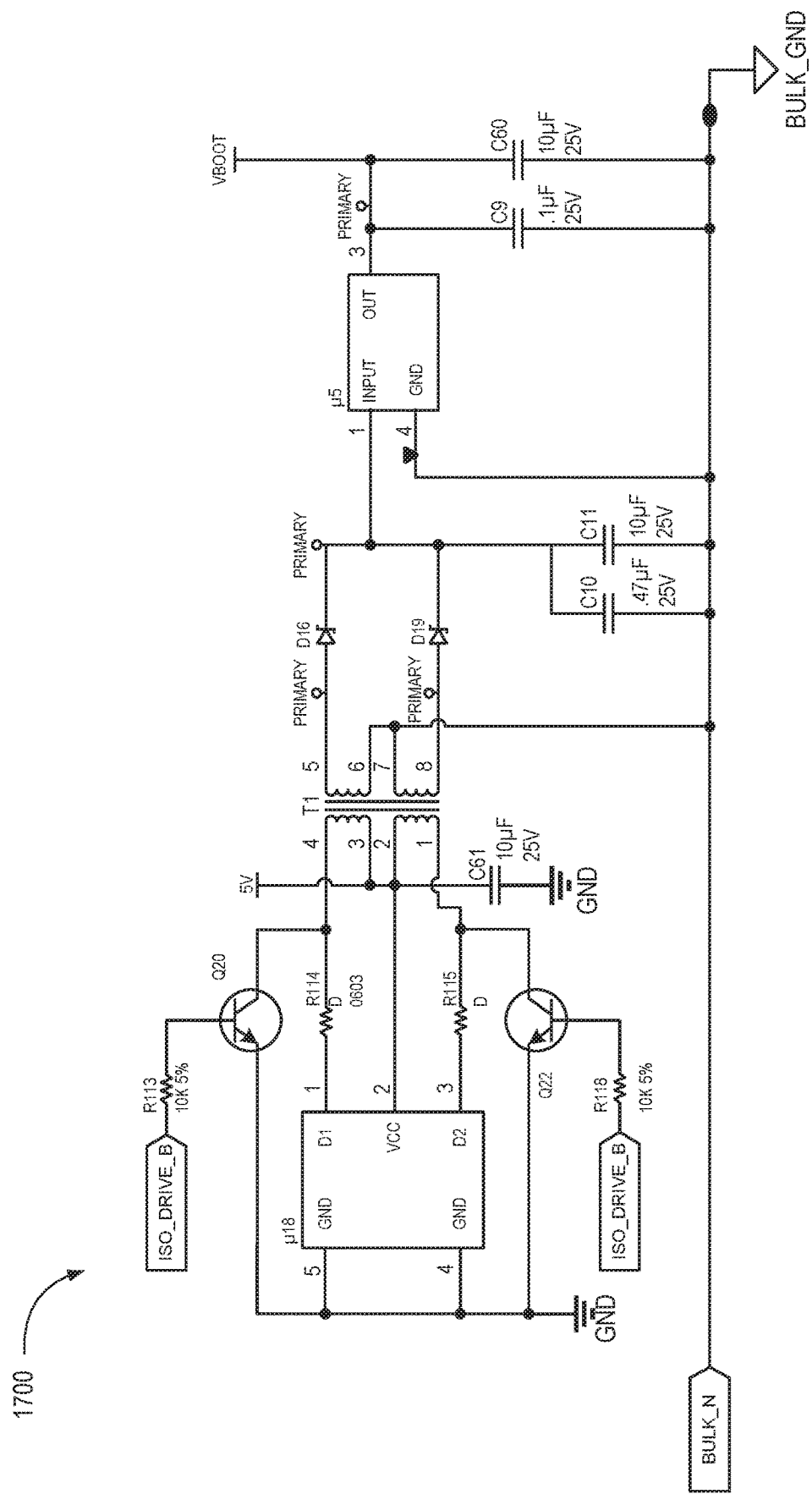
FIG. 17C illustrates an example schematic of a power supply that is one portion of the encoder/decoder system for distribution of encoded electric power, according to one embodiment.
Figure 17D:
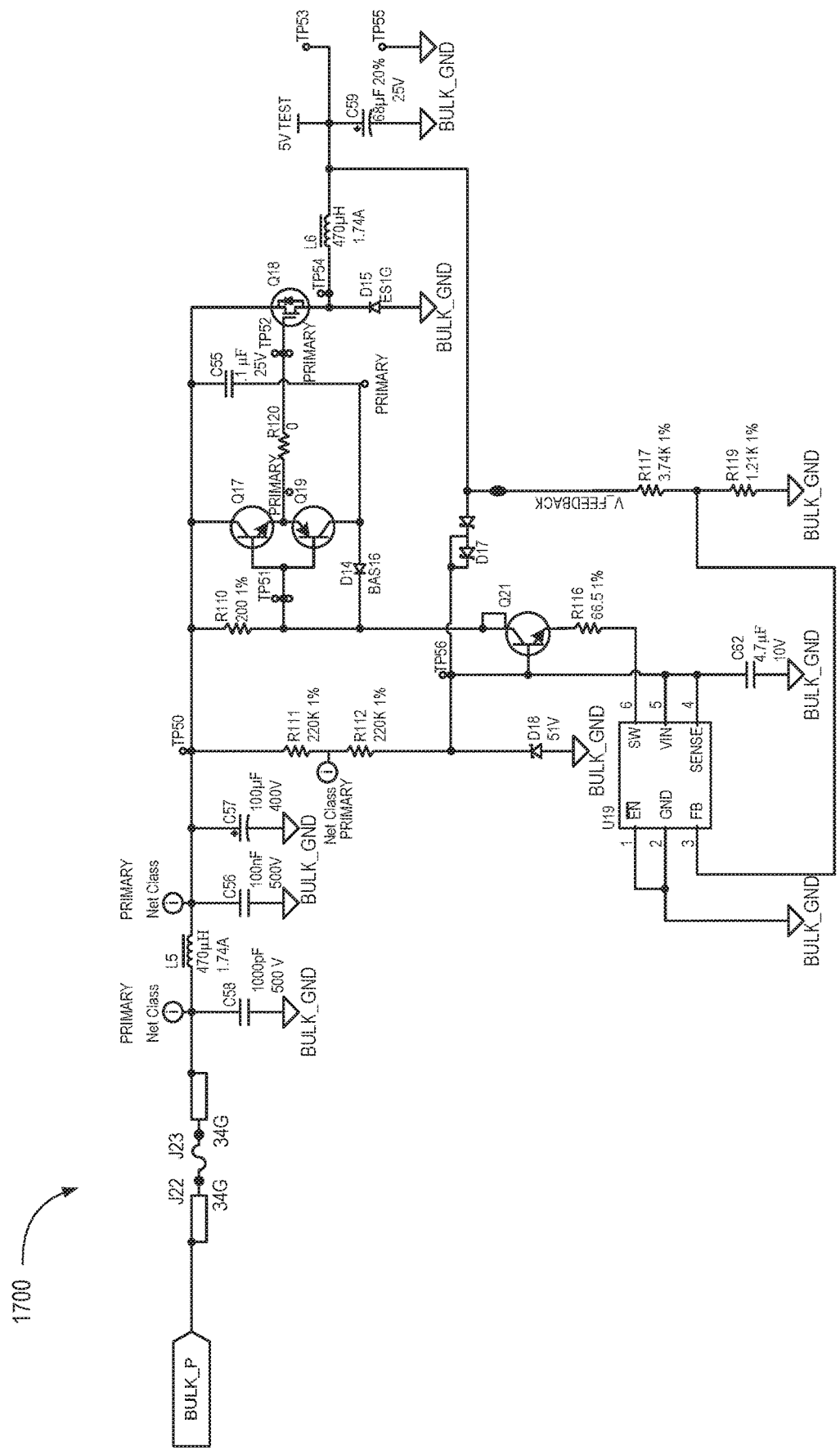
FIG. 17D illustrates an example schematic of another power supply that is one portion of the encoder/decoder system for distribution of encoded electric power, according to one embodiment.

FIG. 16 illustrates an example schematic diagram of an optically isolated power-switching module of an encoder/decoder system for distribution of encoded electric power, according to one embodiment. Optical isolation separates and protects sensitive low voltage components from high-voltage electrical power distribution systems.

FIG. 17A-17D illustrate example schematics of 3.3 V, 5 V, 12 V and other power supplies. Each is needed for this embodiment of the encoder/decoder system for distribution of encoded electric power, according to one embodiment. Each power supply is regulated, accurate, and reliable.

Some of the details and supplemental systems are not shown in full detail to increase clarity. Especially with respect to FIGS. 13A-17D and the corresponding diagrams in the provisional patent applications referenced above, portions of this disclosure contain material which is subject to copyright and/or mask work protection. The copyright and/or mask work owner hereby authorizes facsimile reproduction by anyone of the patent document or the patent disclosure, as it is recorded or filed in the United States Patent and Trademark Office or patent office of any other country or jurisdiction, but otherwise reserves all copyright and/or mask work rights whatsoever. Reproduction and use of works protected by copyright and/or mask work rights for, without limitation, production, manufacturing, reverse engineering, fabrication, sales, training, and the like are expressly reserved.

The examples and illustrations provided relate to specific embodiments and implementations of a few of the many possible variations. It is understood that this disclosure is not limited to the precise configurations and components disclosed herein and that some embodiments may be combined and/or elements may be omitted from described embodiments. Accordingly, many changes may be made to the details of the above-described embodiments without departing from the underlying principles of this disclosure. The following claims are part of the present disclosure, are expressly incorporated into the detailed description, and are consistent with the various embodiments or combination of embodiments described herein. The scope of the present invention should, therefore, be determined in the context of and to at least encompass the claims below.

What is claimed is:

1. An anti-theft power device, comprising:
    an encoder at a transmitting end of a power distribution system to encode power for distribution as encoded power to a receiving end of the power distribution system, wherein the encoder is configured to:
        couple two input phases of power onto a first set of two of at least three encoded outputs at a first time, onto a second set of two of the at least three encoded outputs at a second time, and onto a third set of two of the at least three encoded outputs at a third time; and
    a decoder at a receiving end of the power distribution system to receive the encoded power and decode the encoded power for consumption by a load.

2. The anti-theft power device of claim 1, wherein the encoder is integrated within a step-down transformer.

3. The anti-theft power device of claim 1, wherein the decoder is integrated within a power meter configured to monitor power consumption by the load.

4. The anti-theft power device of claim 1, wherein the decoder is selectively attachable and detachable from an existing power meter associated with the load.

5. The anti-theft power device of claim 1, wherein the decoder is configured to couple the first set of two of the at least three encoded outputs to two decoded phases of power at the first time, couple the second set of two of the at least three encoded outputs to the two decoded phases of power at the second time, and couple the third set of two of the at least three encoded outputs to the two decoded phases of power at the third time.

6. An anti-theft power system, comprising:
    an encoder comprising:
        a first encoder input to receive a first phase of power;

a second encoder input to receive a second phase of power;

at least a first encoder output, a second encoder output, and a third encoder output; and an encoder controller to selectively transmit:
during a first time period, the first phase of power via the first encoder output and the second phase of power via the second encoder output, and
during a second time period, the first phase of power via an encoder output other than the first encoder output and the second phase of power via an encoder output other than the second encoder output; and a decoder comprising:
a first decoder input coupled to the first encoder output, a second decoder input coupled to the second decoder output, and a third decoder input coupled to the third decoder output;
a first decoder output to output the first phase of power;
a second decoder output to output the second phase of power; and
a decoder controller to selectively couple:
during the first time period, the first decoder input to the first decoder output as the first phase of power and the second decoder input to the second decoder output as the second phase of power, and
during the second time period, the decoder input other than the first decoder input to the first decoder output as the first phase of power and the decoder input other than the second decoder input to the second decoder output as the second phase of power.

7. The anti-theft power system of claim 6, wherein the decoder is integrated within a power meter configured to monitor power consumption by a load.

8. The anti-theft power system of claim 6, wherein the output of the decoder is directly coupled to a load without metering.

9. The anti-theft power system of claim 6, wherein the decoder is selectively attachable and detachable as an add-on component to an existing power meter.

10. The anti-theft power system of claim 6, wherein the first phase of power and the second phase of power have a voltage differential of between approximately 200 Volts and 300 Volts.

11. The anti-theft power system of claim 10, wherein the first phase of power has a voltage relative to ground of between approximately 100 Volts and 150 Volts.

12. The anti-theft power system of claim 6, wherein the encoder further comprises a third encoder input to receive a third phase of power, and at least a fourth encoder output, and
wherein the encoder controller is further configured to selectively transmit:
during the first time period, the third phase of power via the fourth encoder output, and
during the second time period, the third phase of power via an output other than the fourth encoder output.

13. The anti-theft power system of claim 12, wherein the decoder further comprises a fourth decoder input coupled to the fourth encoder output, and a third decoder output to output the third phase of power, and
wherein the decoder controller is further configured to selectively couple:
during the first time period, the fourth encoder output to the third decoder output as the third phase of power, and
during the second time period, the output other than the fourth encoder output to the third decoder output as the third phase of power.

14. An anti-theft power system encoder to encode three-phase power for encoded distribution of split-phase power to multiple decoders, comprising:
an encoder comprising:
a first encoder input to receive a first phase of power;
a second encoder input to receive a second phase of power;
a third encoder input to receive a third phase of power;
at least three encoder outputs for each encoded connection to a decoder; and
an encoder controller to selectively couple:
during a first time period, two of the encoder inputs corresponding to two different phases of power to a first set of two of the at least three encoder outputs associated with each encoded connection to a decoder; and
during a second time period, two of the encoder inputs corresponding to two different phases of power to a second set of two of the at least three encoder outputs associated with each encoded connection to a decoder.

15. The anti-theft power system encoder of claim 14, wherein the encoder is integrated within a step-down transformer.

16. The anti-theft power system encoder of claim 14, wherein the encoder comprises nine encoder outputs for three encoded connections to three decoders, such that each decoder receives a encoded connection.

17. The anti-theft power system encoder of claim 14, wherein the encoder comprises eighteen encoder outputs for six encoded connections to any number of decoders, some of which share a common encoding.

18. The anti-theft power system encoder of claim 14, wherein the first, second, and third phases of power are part of one of: a 120/208 V three-phase power distribution model and a 277/480 V three-phase power distribution model.

19. The anti-theft power system encoder of claim 14, wherein the encoder comprises a neutral line input and passes the neutral input unencoded to each decoder.

20. The anti-theft power system encoder of claim 14, further comprising a fourth encoder input to receive a neutral line of power, wherein the at least three encoder outputs for each encoded connection to a decoder comprises at least four encoder outputs, wherein during the first time period the neutral line is encoded on one of the four encoder outputs, and wherein during the second time period the neutral line is encoded on a different one of the four encoder outputs.

* * * * *